US012716926B2

(12) United States Patent
Balteanu et al.

(10) Patent No.: US 12,716,926 B2
(45) Date of Patent: Aug. 25, 2026

(54) POWER DETECTION IN RADIO FREQUENCY SYSTEMS

(71) Applicant: Skyworks Solutions, Inc., Irvine, CA (US)

(72) Inventors: Florinel G. Balteanu, Irvine, CA (US); Ashish Vijay Pingale, Irvine, CA (US); Kiran Tej Thoomu, Irvine, CA (US); Yunyoung Choi, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 537 days.

(21) Appl. No.: 18/332,196

(22) Filed: Jun. 9, 2023

(65) Prior Publication Data

US 2023/0400491 A1 Dec. 14, 2023

Related U.S. Application Data

(60) Provisional application No. 63/366,170, filed on Jun. 10, 2022, provisional application No. 63/366,171, filed on Jun. 10, 2022.

(51) Int. Cl.
*G01R 29/08* (2006.01)
*H04B 17/10* (2015.01)

(52) U.S. Cl.
CPC ....... *G01R 29/0871* (2013.01); *H04B 17/102* (2015.01)

(58) Field of Classification Search
None
See application file for complete search history.

(56) References Cited

U.S. PATENT DOCUMENTS

| | | | |
|---|---|---|---|
| 7,496,339 | B2 | 2/2009 | Balteanu et al. |
| 8,718,188 | B2 | 5/2014 | Balteanu et al. |
| 8,786,371 | B2 | 7/2014 | Popplewell et al. |
| 8,981,847 | B2 | 3/2015 | Balteanu |
| 9,092,393 | B2 | 7/2015 | Whitefield et al. |
| 9,118,277 | B2 | 8/2015 | Balteanu et al. |
| 9,143,096 | B2 | 9/2015 | Balteanu et al. |
| 9,189,430 | B2 | 11/2015 | Ross et al. |
| 9,197,128 | B2 | 11/2015 | Popplewell et al. |
| 9,294,054 | B2 | 3/2016 | Balteanu et al. |
| 9,445,371 | B2 | 9/2016 | Khesbak et al. |
| 9,584,070 | B2 | 2/2017 | Balteanu et al. |
| 9,606,947 | B2 | 3/2017 | Ross et al. |

(Continued)

OTHER PUBLICATIONS

International Search Report and Written Opinion in application No. PCT/US2023/072745, mailed on Mar. 5, 2024, in 10 pages.

*Primary Examiner* — Andrea Lindgren Baltzell
*Assistant Examiner* — Malane Lieng
(74) *Attorney, Agent, or Firm* — Knobbe, Martens, Olson & Bear, LLP

(57) ABSTRACT

Apparatus and methods for power detection in radio frequency (RF) systems are disclosed. In certain embodiments, a power detection system includes a power amplifier, a directional coupler connected to an output of the power amplifier, and a power detector that generates a differential power detection signal based on a single-ended radio frequency input signal received from the directional coupler. The differential power detection signal indicates an output power of the power amplifier, for example, a root mean square (RMS) output power.

17 Claims, 24 Drawing Sheets

(56) References Cited

U.S. PATENT DOCUMENTS 9,668,215 B2 5/2017 Balteanu et al.
9,673,707 B2 6/2017 Popplewell et al.
9,702,911 B2 * 7/2017 Breakenridge ........ G01R 21/10
9,806,676 B2 10/2017 Balteanu et al.
9,831,834 B2 11/2017 Balteanu et al.
9,876,473 B2 1/2018 Khesbak et al.
9,893,682 B2 2/2018 Zhu et al.
9,935,582 B2 4/2018 Balteanu et al.
9,948,241 B2 4/2018 Popplewell et al.
9,990,322 B2 6/2018 Whitefield et al.
9,991,856 B2 6/2018 Khesbak et al.
10,080,192 B2 9/2018 Balteanu et al.
10,110,169 B2 10/2018 Khesbak et al.
10,164,582 B2 12/2018 Zhu et al.
10,181,820 B2 1/2019 Balteanu et al.
10,270,394 B2 4/2019 Drogi et al.
10,277,177 B2 4/2019 Khesbak et al.
10,333,470 B2 6/2019 Balteanu et al.
10,381,983 B2 8/2019 Balteanu et al.
10,402,356 B2 9/2019 Ross et al.
10,404,166 B2 9/2019 Khesbak et al.
10,404,217 B2 9/2019 Popplewell et al.
10,454,428 B2 10/2019 Khesback et al.
10,454,429 B2 10/2019 Balteanu et al.
10,477,550 B2 11/2019 Balteanu
10,516,368 B2 12/2019 Balteanu et al.
10,536,116 B2 1/2020 Balteanu et al.
10,574,192 B2 2/2020 Zhu et al.
10,615,757 B2 4/2020 Balteanu et al.
10,812,023 B2 10/2020 Balteanu et al.
10,862,430 B2 12/2020 Drogi et al.
10,873,297 B2 12/2020 Khesbak et al.
10,985,703 B2 4/2021 Balteanu et al.
10,985,711 B2 4/2021 Balteanu et al.
11,038,471 B2 6/2021 Drogi et al.
11,064,491 B2 7/2021 Balteanu
11,165,397 B2 * 11/2021 Arfaei Malekzadeh .. H03F 1/56
11,165,514 B2 11/2021 Balteanu et al.
11,196,340 B2 12/2021 Khesbak et al.
11,223,323 B2 1/2022 Drogi et al.
11,223,324 B2 1/2022 Balteanu et al.
11,223,325 B2 1/2022 Drogi et al.
11,239,800 B2 2/2022 Drogi et al.
11,303,255 B2 4/2022 Khesbak et al.
11,374,538 B2 6/2022 Drogi et al.
11,387,797 B2 7/2022 Drogi et al.
11,431,357 B2 8/2022 Balteanu et al.
11,444,576 B2 9/2022 Drogi et al.
11,469,714 B2 10/2022 Drogi et al.
11,476,815 B2 10/2022 Drogi et al.
11,489,501 B2 * 11/2022 Rabjohn .................. H04B 1/40
11,558,015 B2 1/2023 Balteanu et al.
11,595,005 B2 2/2023 Balteanu et al.
11,595,006 B2 2/2023 Khesbak et al.
11,626,933 B2 4/2023 Balteanu et al.
11,658,615 B2 5/2023 Balteanu et al.
11,677,357 B2 6/2023 Drogi et al.
11,683,013 B2 6/2023 Drogi et al.
2018/0159476 A1 6/2018 Balteanu et al.
2018/0159478 A1 6/2018 Balteanu et al.
2020/0127619 A1 4/2020 Khesbak et al.
2020/0162028 A1 5/2020 Balteanu et al.
2021/0036724 A1 2/2021 Lam
2022/0021359 A1 1/2022 Arfaei Malekzadeh et al.
2022/0021468 A1 1/2022 Balteanu et al.
2022/0069775 A1 3/2022 Balteanu et al.
2022/0085764 A1 3/2022 Drogi et al.
2022/0085765 A1 3/2022 Drogi et al.
2022/0120788 A1 4/2022 Wang et al.
2022/0247370 A1 8/2022 Khesbak et al.
2022/0286093 A1 9/2022 Drogi et al.
2022/0311469 A1 9/2022 Brunel et al.
2022/0393657 A1 12/2022 Drogi et al.
2023/0063006 A1 3/2023 Khesbak et al.
2023/0065303 A1 3/2023 Khesbak et al.
2023/0065932 A1 3/2023 Khesbak et al.
2023/0082437 A1 3/2023 Balteanu et al.
2023/0108810 A1 4/2023 Choi et al.
2023/0120462 A1 4/2023 Balteanu et al.
2023/0155554 A1 5/2023 Balteanu et al.

* cited by examiner

POWER DETECTION IN RADIO FREQUENCY SYSTEMS

CROSS-REFERENCE TO RELATED APPLICATIONS

This application claims the benefit of priority under 35 U.S.C. § 119 of U.S. Provisional Patent Application No. 63/366,171, filed Jun. 10, 2022 and titled "POWER DETECTION IN RADIO FREQUENCY SYSTEMS," and of U.S. Provisional Patent Application No. 63/366,170, filed Jun. 10, 2022 and titled "ENVELOPE TRACKING CALIBRATION IN RADIO FREQUENCY SYSTEMS," each of which is herein incorporated by reference in its entirety.

BACKGROUND

Field

Embodiments of the invention relate to electronic systems, and in particular, to power detection and calibration for radio frequency electronics.

Description of the Related Technology

Radio frequency (RF) communication systems can be used for transmitting and/or receiving signals of a wide range of frequencies. For example, an RF communication system can be used to wirelessly communicate RF signals in a frequency range of about 30 kHz to 300 GHz, for instance, in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

SUMMARY

In certain embodiments, the present disclosure relates to a mobile device. The mobile device includes a transceiver configured to generate a radio frequency transmit signal. The mobile device further includes a front end system including a power amplifier configured to amplify the radio frequency transmit signal to generate a radio frequency output signal, a directional coupler configured to generate a single-ended radio frequency signal based on sensing the radio frequency output signal, and a power detector configured to receive the single-ended radio frequency signal and to generate a differential power detection signal that indicates an output power of the power amplifier.

In various embodiments, the mobile device further includes an antenna configured to transmit the radio frequency output signal. According to a number of embodiments, the single-ended radio frequency signal indicates a forward power to the antenna. In accordance with several embodiments, the single-ended radio frequency signal indicates a reverse power to the antenna.

In some embodiments, the front end system further includes a plurality of power detectors including the power detector, and a multiplexer configured to output a selected differential power detection signal chosen from the plurality of power detectors. According to a number of embodiments, the front end system further includes an amplifier configured to convert the selected differential power detection signal to a single-ended power detection signal referenced to an offset. In accordance with several embodiments, the front end system further includes a cascade of two or more linearization cells configured to generate a linearized detection signal based on the single-ended power detection signal and the offset. According to various embodiments, the two or more power detectors are configured to detect an output power of at least two power amplifiers. In accordance with a number of embodiments, the two or more power detectors are configured to detect a forward power of the power amplifier and a reverse power of the power amplifier.

In several embodiments, the radio frequency output signal is a cellular signal in fifth generation frequency range two.

In various embodiments, the mobile device further includes a baseband receiver configured to generate power data based on the differential power detection signal.

In certain embodiments, the present disclosure relates to a power amplifier system. The power amplifier system includes a power amplifier configured to amplify a radio frequency transmit signal to generate a radio frequency output signal, a directional coupler configured to generate a single-ended radio frequency signal based on sensing the radio frequency output signal, and a power detector configured to receive the single-ended radio frequency signal and to generate a differential power detection signal that indicates an output power of the power amplifier.

In various embodiments, the power amplifier system further includes a plurality of power detectors including the power detector, and a multiplexer configured to provide a selected differential power detection signal from the plurality of power detectors. According to a number of embodiments, the power amplifier system further includes an amplifier configured to convert the selected differential power detection signal to a single-ended power detection signal referenced to an offset. In accordance with several embodiments, the power amplifier system further includes a cascade of two or more linearization cells configured to generate a linearized detection signal based on the single-ended power detection signal and the offset.

In certain embodiments, the present disclosure relates to a method of signal power detection in a mobile device. The method includes generating a radio frequency transmit signal using a transceiver, amplifying the radio frequency transmit signal to generate a radio frequency output signal using a power amplifier, generating a single-ended radio frequency signal based on sensing the radio frequency output signal using a directional coupler, and generating a differential power detection signal from the single-ended radio frequency signal using a power detector, the differential power detection signal indicating an output power of the power amplifier.

In some embodiments, the single-ended radio frequency signal indicates a forward power to an antenna.

In various embodiments, the single-ended radio frequency signal indicates a reverse power to an antenna.

In several embodiments, the method further includes generating a selected differential power detection signal from choosing from amongst a plurality of power detectors using a multiplexer, the plurality of power detectors including the power detector. According to a number of embodiments, the front end system further includes an amplifier that converts the selected differential power detection signal to a single-ended power detection signal referenced to an offset, and the method further includes generating a linearized detection signal based on the single-ended power detection signal and the offset using a cascade of two or more linearization cells.

In certain embodiments, the present disclosure relates to a method of calibrating for envelope alignment. The method includes providing an envelope signal with a peak along an envelope path to an envelope tracker, providing a radio frequency signal with a first pair of peaks to a power amplifier along a radio frequency signal path, sensing an output of the power amplifier to generate a radio frequency signal, and generating a power detection signal using a power detector that receives the radio frequency signal. The power detection signal includes a second pair of peaks corresponding to the first pair of peaks of the radio frequency signal. The method further includes calibrating a delay between the envelope signal and the radio frequency signal based on comparing a size of a first peak of the second pair of peaks to a size of a second peak of the second pair of peaks.

In some embodiments, the method further includes changing the delay until the size of the first peak is substantially equal to the size of the second peak.

In various embodiments, calibrating the delay includes controlling a delay of a controllable delay circuit along the envelope path.

In several embodiments, the method further includes sensing the output of the power amplifier after a transmit/receive switch.

In a number of embodiments, the method further includes changing a supply voltage of the power amplifier in relation to the envelope signal using the envelope tracker.

In some embodiments, the envelope signal for calibrating for envelope alignment is substantially triangular, the peak of the envelope signal corresponding to a peak of a triangle.

In several embodiments, the first pair of peaks are each of substantially equal in size.

In various embodiments, the radio frequency signal for calibrating for envelope alignment is substantially triangular, the first pair of peaks of the radio frequency signal corresponding to peaks of a pair of triangles.

In some embodiments, the method further includes processing the power detection signal using a baseband receiver without using any mixers for frequency downconversion.

In several embodiments, the method further includes multiplexing a plurality of power detection signals to select the power detection signal. According to a number of embodiments, the method further includes generating the plurality of power detection signals based on a forward power to an antenna and a reverse power to the antenna. In accordance with various embodiments, the method further includes generating the plurality of power detection signals based on detecting an output power of a plurality of power amplifiers.

In some embodiments, the radio frequency signal is a cellular signal in fifth generation frequency range two.

In certain embodiments, the present disclosure relates to a mobile device. The mobile device includes a transceiver configured to provide a radio frequency signal with a first pair of peaks along a radio frequency signal path. The mobile device further includes a front end system including a power amplifier configured to amplify the radio frequency signal, an envelope tracker configured to control a supply voltage of the power amplifier based on an envelope signal having a peak, a directional coupler configured to generate a radio frequency signal based on sensing an output of the power amplifier, and a power detector configured to generate a power detection signal based on the radio frequency signal, the power detection signal including a second pair of peaks corresponding to the first pair of peaks of the radio frequency signal. The mobile device further includes a baseband processor configured to provide the envelope signal along an envelope path to the envelope tracker, the baseband processor further configured to generate calibration data based on comparing a size of a first peak of the second pair of peaks relative to a size of a second peak of the second pair of peaks, the calibration data operable to calibrate a delay between the envelope signal and the radio frequency signal.

In several embodiments, the baseband processor is further configured to control the delay until the size of the first peak is substantially equal to the size of the second peak.

In some embodiments, the front end system further includes a multiplexer configured to select the power detection signal from a plurality of power detection signals. According to a number of embodiments, the mobile device further includes a plurality of power detectors configured to generate the plurality of power detection signals, the plurality of power detectors including a forward power detector operable to detect a forward power to an antenna and a reverse power detector operable to detect a reverse power to the antenna. In accordance with various embodiments, the mobile device further includes a plurality of power amplifiers and a plurality of power detectors configured to generate the plurality of power detection signals based on the plurality of power detectors each detecting an output power of a corresponding one of the plurality of power amplifiers.

In certain embodiments, the present disclosure relates to a radio frequency front end system. The radio frequency front end system includes a power amplifier configured to receive a radio frequency signal with a first pair of peaks along a radio frequency signal path, and an envelope tracker configured to receive an envelope signal with a peak along an envelope path. The envelope tracker is configured to control a supply voltage of the power amplifier based on the envelope signal. The radio frequency front end system further includes a directional coupler configured to generate a radio frequency signal based on sensing an output of the power amplifier, and a power detector configured to generate a power detection signal based on the radio frequency signal. The power detection signal includes a second pair of peaks corresponding to the first pair of peaks of the radio frequency signal. The radio frequency front end system further includes a controllable delay component configured to receive calibration data generated by comparing a size of a first peak of the second pair of peaks relative to a size of a second peak of the second pair of peaks, the calibration data operable to calibrate a delay between the envelope signal and the radio frequency signal.

In some embodiments, the front end system further includes a multiplexer configured to select the power detection signal from a plurality of power detection signals.

In various embodiments, the controllable delay component is along the envelope path.

DETAILED DESCRIPTION OF EMBODIMENTS

Figure 1:
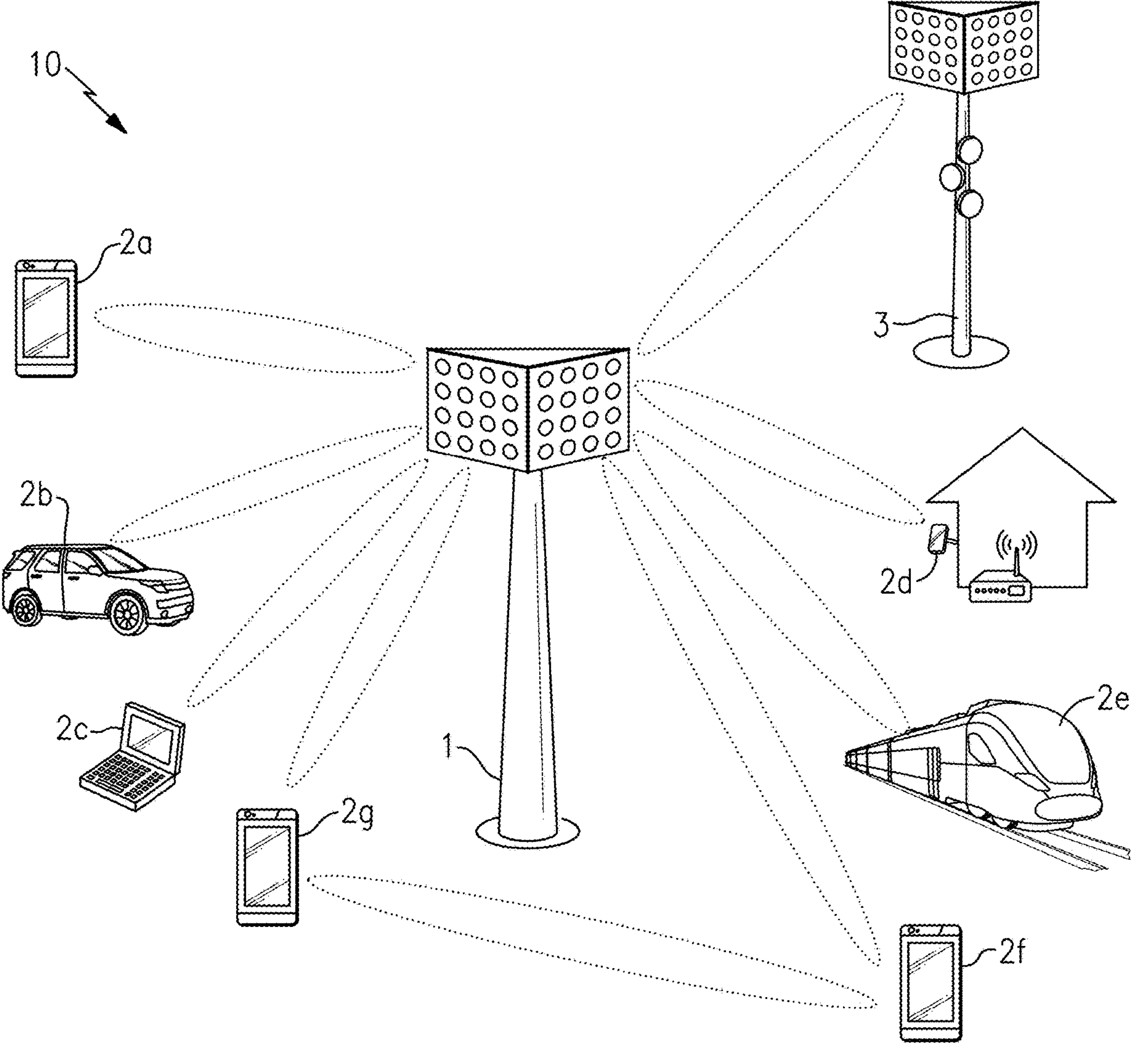
FIG. 1 is a schematic diagram of one example of a communication network.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release 15, and introduced Phase 2 of 5G technology in Release 16. Subsequent 3GPP releases will further evolve and expand 5G technology. 5G technology is also referred to herein as 5G New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

FIG. 1 is a schematic diagram of one example of a communication network 10. The communication network 10 includes a macro cell base station 1, a small cell base station 3, and various examples of user equipment (UE), including a first mobile device 2*a*, a wireless-connected car 2*b*, a laptop 2$c$, a stationary wireless device 2$d$, a wireless-connected train 2$e$, a second mobile device 2$f$, and a third mobile device 2$g$.

Although specific examples of base stations and user equipment are illustrated in FIG. 1, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein.

The illustrated communication network 10 of FIG. 1 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 1. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 1, the communication links include not only communication links between UE and base stations, but also UE to UE communications and base station to base station communications. For example, the communication network 10 can be implemented to support self-fronthaul and/or self-backhaul.

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof.

For example, 5G NR can operate with different specifications across frequency bands for 5G, including with flexible numerology compared with fixed numerology for 4G. FR1 includes existing and new bands and corresponds to 450 MHz-6 GHz; sub-6 GHz bands with numerology subcarrier spacing of 15 kHz, 30 kHz and 60 kHz. Additionally, FR2 includes new bands operating over millimeter wave frequencies with numerology subcarrier spacing of 60 kHz, 120 kHz and 240 kHz to be able to handle higher phase noise and Doppler effects (for instance, for train applications up to 500 km/h). FR2 includes both FR2-1 (24 GHz to 52 GHz) and FR2-2 (52 GHz to 71 GHz).

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. In one embodiment, one or more of the mobile devices support a HPUE power class specification.

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (IoT) applications.

The communication network 10 of FIG. 1 can be used to support a wide variety of advanced communication features, including, but not limited to, eMBB, uRLLC, and/or mMTC.

Figure 2A:
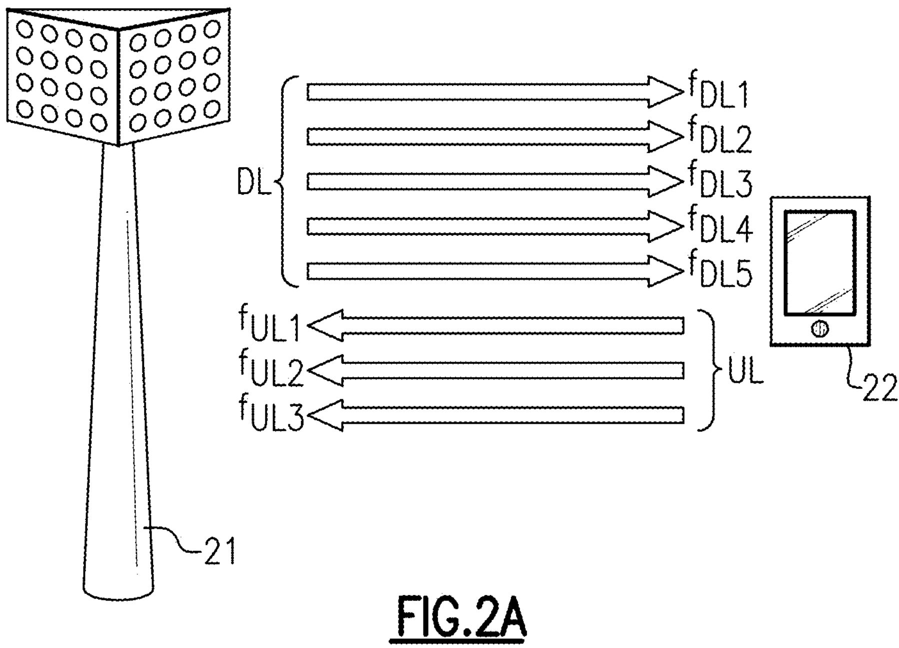
FIG. 2A is a schematic diagram of one example of a communication link using carrier aggregation.

FIG. 2A is a schematic diagram of one example of a communication link using carrier aggregation. Carrier aggregation can be used to widen bandwidth of the communication link by supporting communications over multiple frequency carriers, thereby increasing user data rates and enhancing network capacity by utilizing fragmented spectrum allocations.

In the illustrated example, the communication link is provided between a base station 21 and a mobile device 22. As shown in FIG. 2A, the communications link includes a downlink channel used for RF communications from the base station 21 to the mobile device 22, and an uplink channel used for RF communications from the mobile device 22 to the base station 21.

Although FIG. 2A illustrates carrier aggregation in the context of FDD communications, carrier aggregation can also be used for TDD communications.

In certain implementations, a communication link can provide asymmetrical data rates for a downlink channel and an uplink channel. For example, a communication link can be used to support a relatively high downlink data rate to enable high speed streaming of multimedia content to a mobile device, while providing a relatively slower data rate for uploading data from the mobile device to the cloud.

In the illustrated example, the base station 21 and the mobile device 22 communicate via carrier aggregation, which can be used to selectively increase bandwidth of the communication link. Carrier aggregation includes contiguous aggregation, in which contiguous carriers within the same operating frequency band are aggregated. Carrier aggregation can also be non-contiguous, and can include carriers separated in frequency within a common band or in different bands.

In the example shown in FIG. 2A, the uplink channel includes three aggregated component carriers $f_{UL1}$, $f_{UL2}$, and $f_{UL3}$. Additionally, the downlink channel includes five aggregated component carriers $f_{DL1}$, $f_{DL2}$, $f_{DL3}$, $f_{DL4}$, and $f_{DL5}$. Although one example of component carrier aggregation is shown, more or fewer carriers can be aggregated for uplink and/or downlink. Moreover, a number of aggregated carriers can be varied over time to achieve desired uplink and downlink data rates.

For example, a number of aggregated carriers for uplink and/or downlink communications with respect to a particular mobile device can change over time. For example, the number of aggregated carriers can change as the device moves through the communication network and/or as network usage changes over time.

Figure 2B:
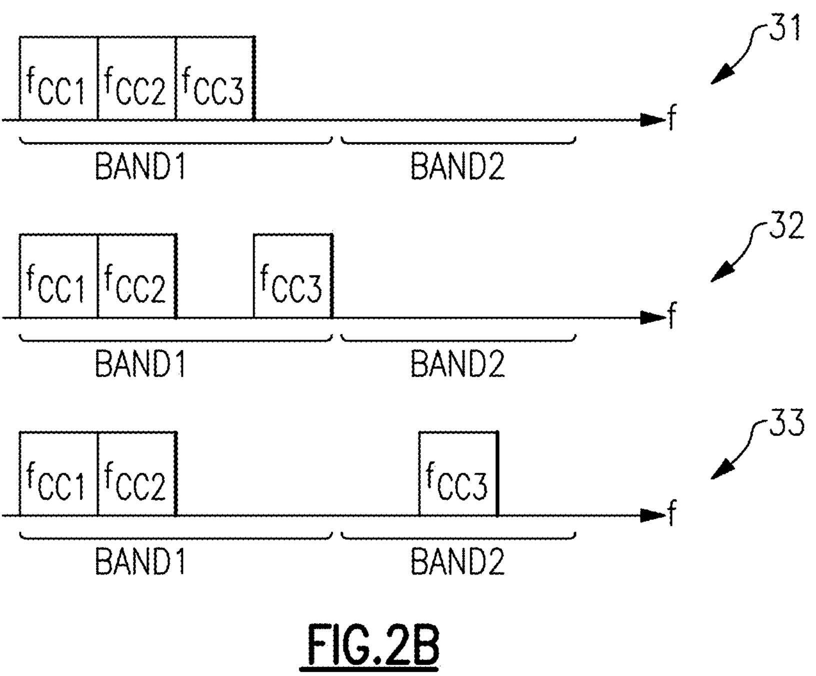
FIG. 2B illustrates various examples of uplink carrier aggregation for the communication link of FIG. 2A.

FIG. 2B illustrates various examples of uplink carrier aggregation for the communication link of FIG. 2A. FIG. 2B includes a first carrier aggregation scenario 31, a second carrier aggregation scenario 32, and a third carrier aggregation scenario 33, which schematically depict three types of carrier aggregation.

The carrier aggregation scenarios 31-33 illustrate different spectrum allocations for a first component carrier $f_{UL1}$, a second component carrier $f_{UL2}$, and a third component carrier $f_{UL3}$. Although FIG. 2B is illustrated in the context of aggregating three component carriers, carrier aggregation can be used to aggregate more or fewer carriers. Moreover, although illustrated in the context of uplink, the aggregation scenarios are also applicable to downlink.

The first carrier aggregation scenario 31 illustrates intra-band contiguous carrier aggregation, in which component carriers that are adjacent in frequency and in a common frequency band are aggregated. For example, the first carrier aggregation scenario 31 depicts aggregation of component carriers $f_{UL1}$, $f_{UL2}$, and $f_{UL3}$ that are contiguous and located within a first frequency band BAND1.

With continuing reference to FIG. 2B, the second carrier aggregation scenario 32 illustrates intra-band non-continuous carrier aggregation, in which two or more components carriers that are non-adjacent in frequency and within a common frequency band are aggregated. For example, the second carrier aggregation scenario 32 depicts aggregation of component carriers $f_{UL1}$, $f_{UL2}$, and $f_{UL3}$ that are non-contiguous, but located within a first frequency band BAND1.

The third carrier aggregation scenario 33 illustrates inter-band non-contiguous carrier aggregation, in which component carriers that are non-adjacent in frequency and in multiple frequency bands are aggregated. For example, the third carrier aggregation scenario 33 depicts aggregation of component carriers $f_{UL1}$ and $f_{UL2}$ of a first frequency band BAND1 with component carrier $f_{UL3}$ of a second frequency band BAND2.

Figure 2C:
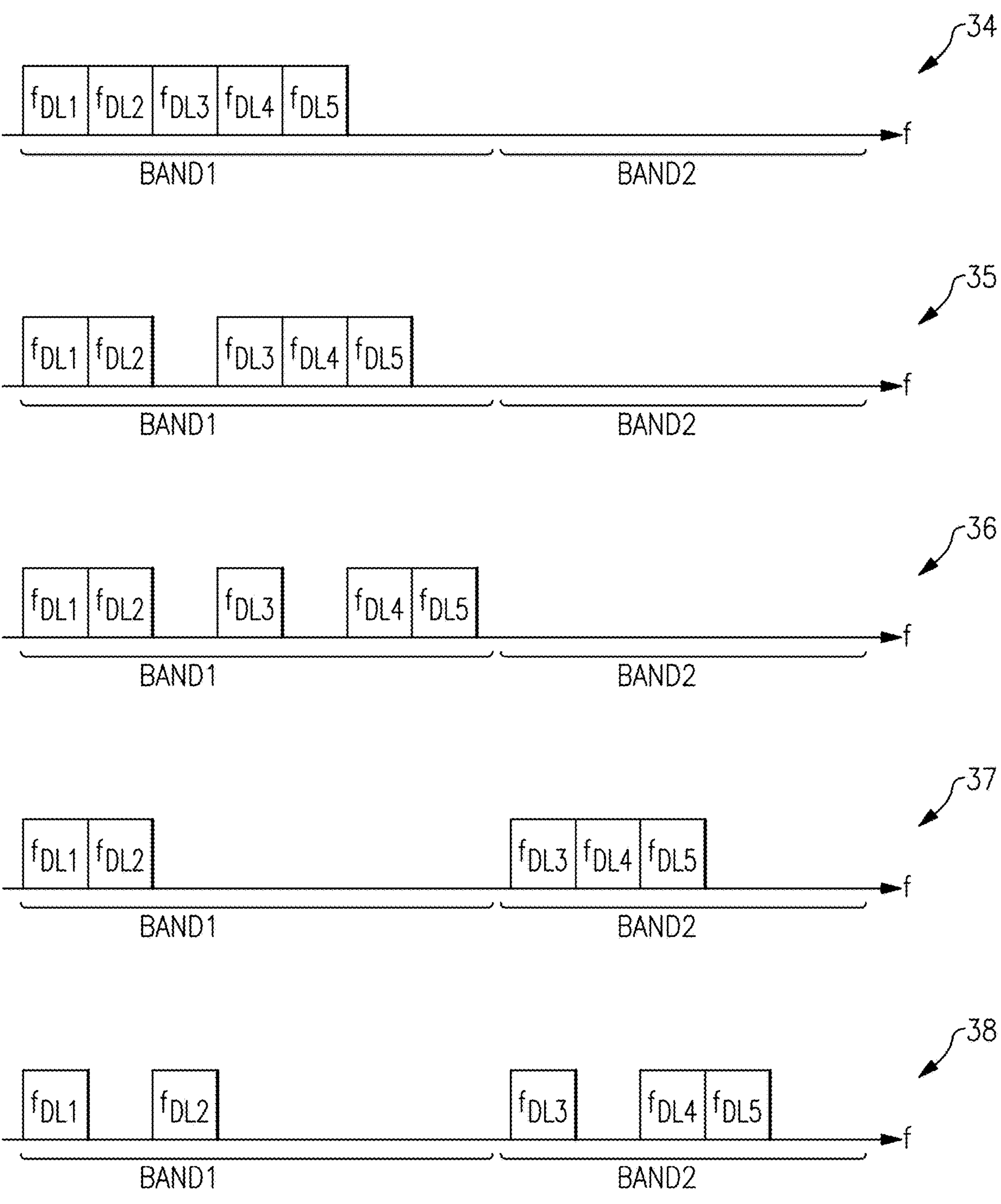
FIG. 2C illustrates various examples of downlink carrier aggregation for the communication link of FIG. 2A.

FIG. 2C illustrates various examples of downlink carrier aggregation for the communication link of FIG. 2A. The examples depict various carrier aggregation scenarios 34-38 for different spectrum allocations of a first component carrier $f_{DL1}$, a second component carrier $f_{DL2}$, a third component carrier $f_{DL3}$, a fourth component carrier $f_{DL4}$, and a fifth component carrier $f_{DL5}$. Although FIG. 2C is illustrated in the context of aggregating five component carriers, carrier aggregation can be used to aggregate more or fewer carriers. Moreover, although illustrated in the context of downlink, the aggregation scenarios are also applicable to uplink.

The first carrier aggregation scenario 34 depicts aggregation of component carriers that are contiguous and located within the same frequency band. Additionally, the second carrier aggregation scenario 35 and the third carrier aggregation scenario 36 illustrates two examples of aggregation that are non-contiguous, but located within the same frequency band. Furthermore, the fourth carrier aggregation scenario 37 and the fifth carrier aggregation scenario 38 illustrates two examples of aggregation in which component carriers that are non-adjacent in frequency and in multiple frequency bands are aggregated. As a number of aggregated component carriers increases, a complexity of possible carrier aggregation scenarios also increases.

With reference to FIGS. 2A-2C, the individual component carriers used in carrier aggregation can be of a variety of frequencies, including, for example, frequency carriers in the same band or in multiple bands. Additionally, carrier aggregation is applicable to implementations in which the individual component carriers are of about the same bandwidth as well as to implementations in which the individual component carriers have different bandwidths.

Certain communication networks allocate a particular user device with a primary component carrier (PCC) or anchor carrier for uplink and a PCC for downlink. Additionally, when the mobile device communicates using a single frequency carrier for uplink or downlink, the user device communicates using the PCC. To enhance bandwidth for uplink communications, the uplink PCC can be aggregated with one or more uplink secondary component carriers (SCCs). Additionally, to enhance bandwidth for downlink communications, the downlink PCC can be aggregated with one or more downlink SCCs.

In certain implementations, a communication network provides a network cell for each component carrier. Additionally, a primary cell can operate using a PCC, while a secondary cell can operate using a SCC. The primary and second cells may have different coverage areas, for instance, due to differences in frequencies of carriers and/or network environment.

License assisted access (LAA) refers to downlink carrier aggregation in which a licensed frequency carrier associated with a mobile operator is aggregated with a frequency carrier in unlicensed spectrum, such as WiFi. LAA employs a downlink PCC in the licensed spectrum that carries control and signaling information associated with the communication link, while unlicensed spectrum is aggregated for wider downlink bandwidth when available. LAA can operate with dynamic adjustment of secondary carriers to avoid WiFi users and/or to coexist with WiFi users. Enhanced license assisted access (eLAA) refers to an evolution of LAA that aggregates licensed and unlicensed spectrum for both downlink and uplink. Furthermore, NR-U can operate on top of LAA/eLAA over a 5 GHz band (5150 to 5925 MHz) and/or a 6 GHz band (5925 MHz to 7125 MHz).

Figure 3A:
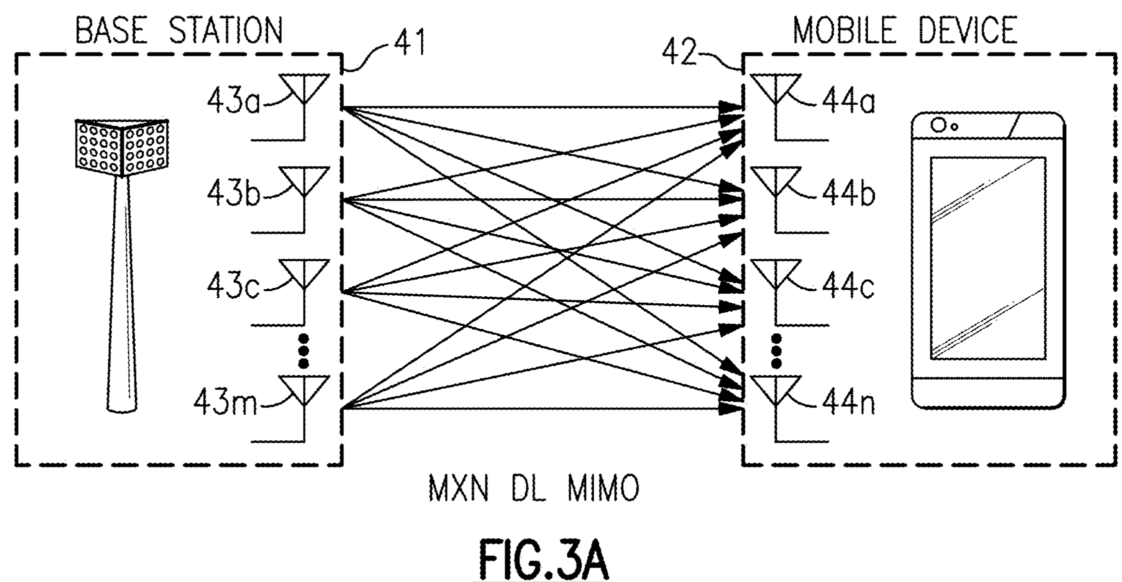
FIG. 3A is a schematic diagram of one example of a downlink channel using multi-input and multi-output (MIMO) communications.
Figure 3B:
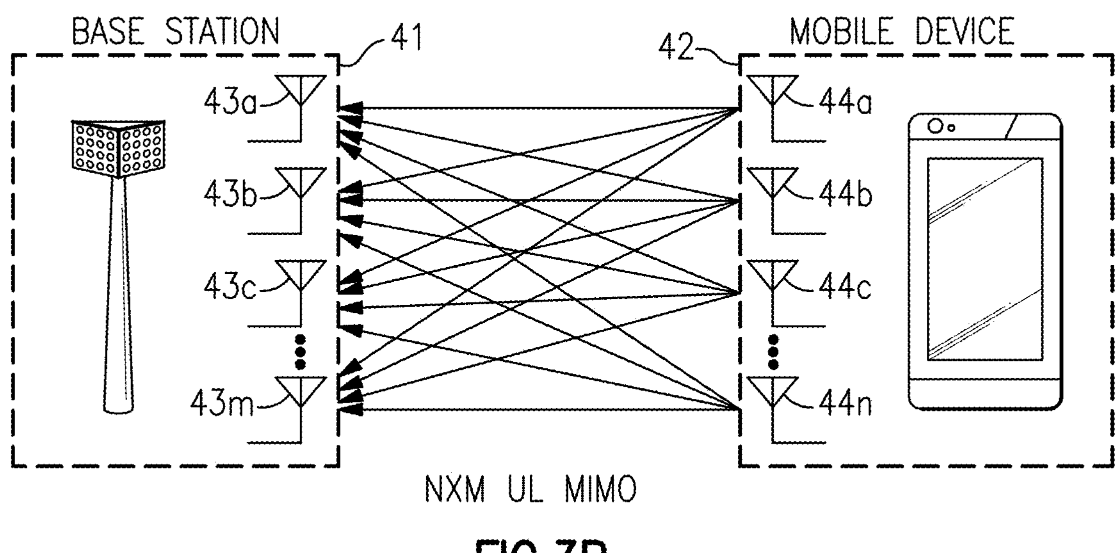
FIG. 3B is schematic diagram of one example of an uplink channel using MIMO communications.

FIG. 3A is a schematic diagram of one example of a downlink channel using multi-input and multi-output (MIMO) communications. FIG. 3B is schematic diagram of one example of an uplink channel using MIMO communications.

MIMO communications use multiple antennas for simultaneously communicating multiple data streams over common frequency spectrum. In certain implementations, the data streams operate with different reference signals to enhance data reception at the receiver. MIMO communications benefit from higher SNR, improved coding, and/or reduced signal interference due to spatial multiplexing differences of the radio environment.

MIMO order refers to a number of separate data streams sent or received. For instance, MIMO order for downlink communications can be described by a number of transmit antennas of a base station and a number of receive antennas for UE, such as a mobile device. For example, two-by-two (2×2) DL MIMO refers to MIMO downlink communications using two base station antennas and two UE antennas. Additionally, four-by-four (4×4) DL MIMO refers to MIMO downlink communications using four base station antennas and four UE antennas.

In the example shown in FIG. 3A, downlink MIMO communications are provided by transmitting using M antennas 43*a*, 43*b*, 43*c*, . . . 43*m* of the base station 41 and receiving using N antennas 44*a*, 44*b*, 44*c*, . . . 44*n* of the mobile device 42. Accordingly, FIG. 3A illustrates an example of m×n DL MIMO.

Likewise, MIMO order for uplink communications can be described by a number of transmit antennas of UE, such as a mobile device, and a number of receive antennas of a base station. For example, 2×2 UL MIMO refers to MIMO uplink communications using two UE antennas and two base station antennas. Additionally, 4×4 UL MIMO refers to MIMO uplink communications using four UE antennas and four base station antennas.

In the example shown in FIG. 3B, uplink MIMO communications are provided by transmitting using N antennas 44*a*, 44*b*, 44*c*, . . . 44*n* of the mobile device 42 and receiving using M antennas 43*a*, 43*b*, 43*c*, . . . 43*m* of the base station 41. Accordingly, FIG. 3B illustrates an example of n×m UL MIMO.

By increasing the level or order of MIMO, data bandwidth of an uplink channel and/or a downlink channel can be increased.

MIMO communications are applicable to communication links of a variety of types, such as FDD communication links and TDD communication links.

Figure 3C:
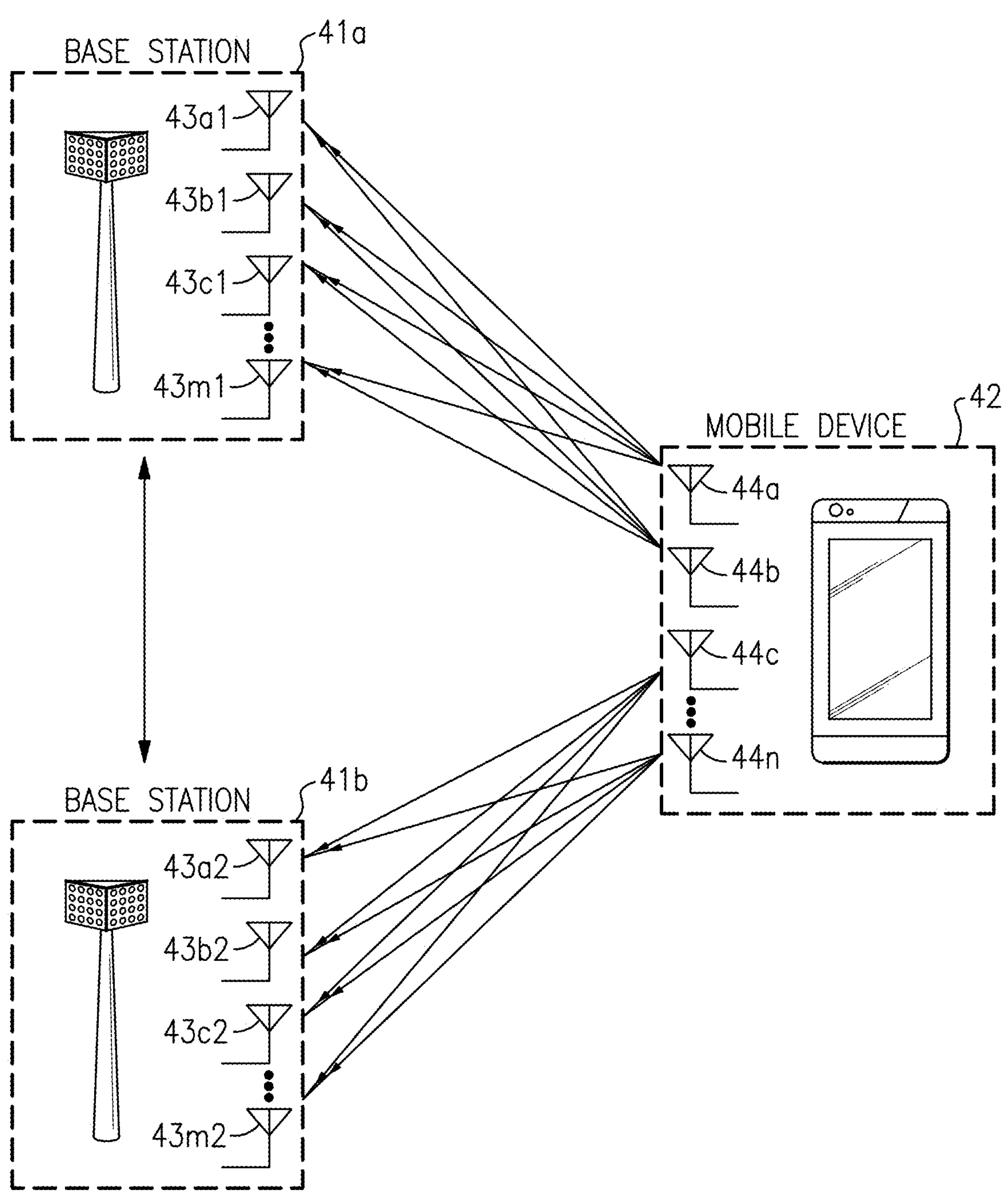
FIG. 3C is schematic diagram of another example of an uplink channel using MIMO communications.

FIG. 3C is schematic diagram of another example of an uplink channel using MIMO communications. In the example shown in FIG. 3C, uplink MIMO communications are provided by transmitting using N antennas 44*a*, 44*b*, 44*c*, . . . 44*n* of the mobile device 42. Additional a first portion of the uplink transmissions are received using M antennas 43*a*1, 43*b*1, 43*c*1, . . . 43*m*1 of a first base station 41*a*, while a second portion of the uplink transmissions are received using M antennas 43*a*2, 43*b*2, 43*c*2, . . . 43*m*2 of a second base station 41*b*. Additionally, the first base station 41*a* and the second base station 41*b* communication with one another over wired, optical, and/or wireless links.

The MIMO scenario of FIG. 3C illustrates an example in which multiple base stations cooperate to facilitate MIMO communications.

With the introduction of the 5G NR air interface standards, 3GPP has allowed for the simultaneous operation of 5G and 4G standards in order to facilitate the transition. This mode can be referred to as Non-Stand-Alone (NSA) operation or E-UTRAN New Radio-Dual Connectivity (EN-DC) and involves both 4G and 5G carriers being simultaneously transmitted from a user equipment (UE).

In certain EN-DC applications, dual connectivity NSA involves overlaying 5G systems onto an existing 4G core network. For dual connectivity in such applications, the control and synchronization between the base station and the UE can be performed by the 4G network while the 5G network is a complementary radio access network tethered to the 4G anchor. The 4G anchor can connect to the existing 4G network with the overlay of 5G data/control.

Figure 4A:
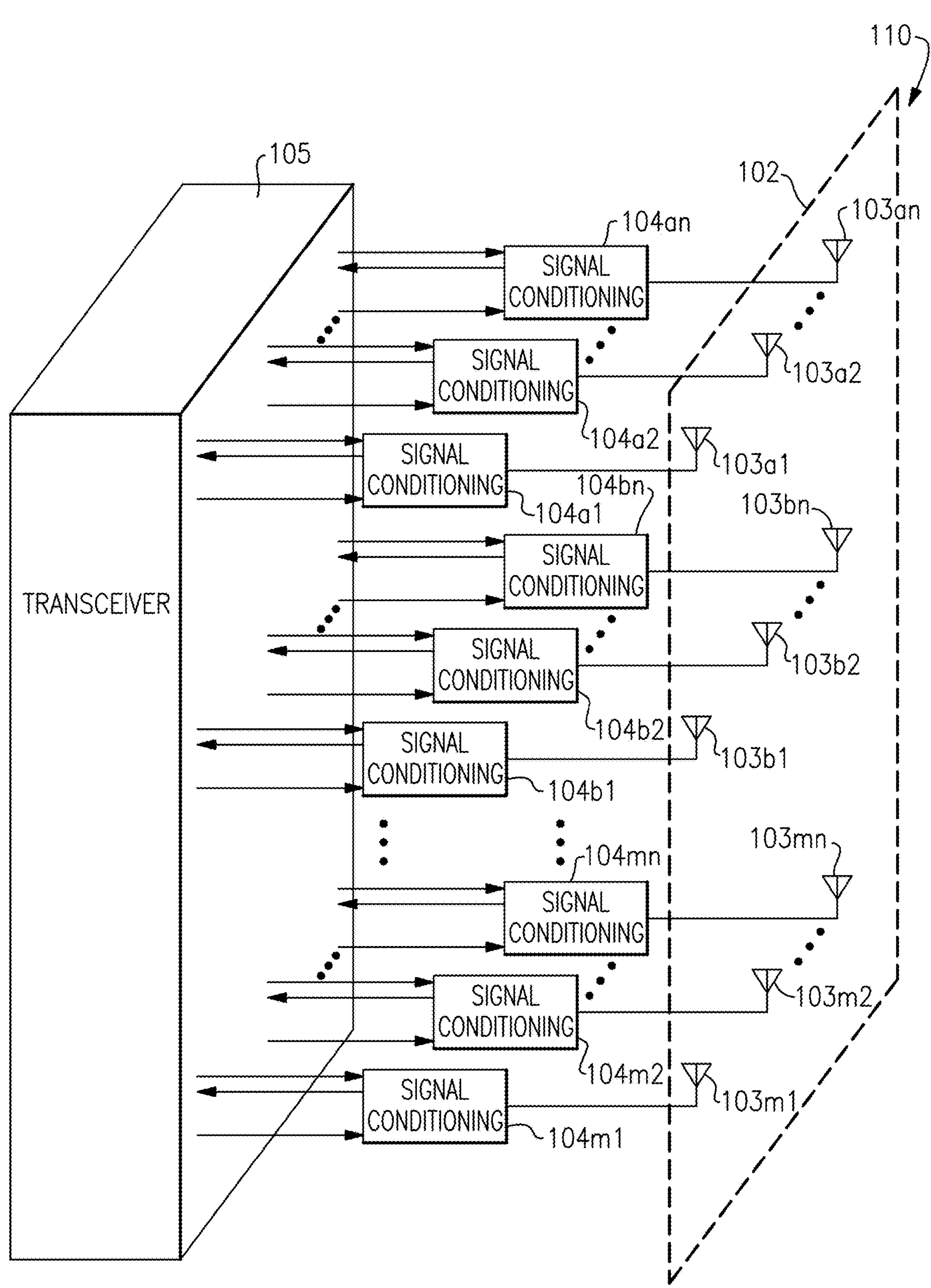
FIG. 4A is a schematic diagram of one example of a communication system that operates with beamforming.

FIG. 4A is a schematic diagram of one example of a communication system 110 that operates with beamforming. The communication system 110 includes a transceiver 105, signal conditioning circuits 104*a*1, 104*a*2 . . . 104*an*, 104*b*1, 104*b*2 . . . 104*bn*, 104*m*1, 104*m*2 . . . 104*mn*, and an antenna array 102 that includes antenna elements 103*a*1, 103*a*2 . . . 103*an*, 103*b*1, 103*b*2 . . . 103*bn*, 103*m*1, 103*m*2 . . . 103*mn*.

Communications systems that communicate using millimeter wave carriers (for instance, 30 GHz to 300 GHz), centimeter wave carriers (for instance, 3 GHz to 30 GHz), and/or other frequency carriers can employ an antenna array to provide beam formation and directivity for transmission and/or reception of signals.

For example, in the illustrated embodiment, the communication system 110 includes an array 102 of m×n antenna elements, which are each controlled by a separate signal conditioning circuit, in this embodiment. As indicated by the ellipses, the communication system 110 can be implemented with any suitable number of antenna elements and signal conditioning circuits.

With respect to signal transmission, the signal conditioning circuits can provide transmit signals to the antenna array 102 such that signals radiated from the antenna elements combine using constructive and destructive interference to generate an aggregate transmit signal exhibiting beam-like qualities with more signal strength propagating in a given direction away from the antenna array 102.

In the context of signal reception, the signal conditioning circuits process the received signals (for instance, by separately controlling received signal phases) such that more signal energy is received when the signal is arriving at the antenna array 102 from a particular direction. Accordingly, the communication system 110 also provides directivity for reception of signals.

The relative concentration of signal energy into a transmit beam or a receive beam can be enhanced by increasing the size of the array. For example, with more signal energy focused into a transmit beam, the signal is able to propagate for a longer range while providing sufficient signal level for RF communications. For instance, a signal with a large proportion of signal energy focused into the transmit beam can exhibit high effective isotropic radiated power (EIRP).

In the illustrated embodiment, the transceiver 105 provides transmit signals to the signal conditioning circuits and processes signals received from the signal conditioning circuits. As shown in FIG. 4A, the transceiver 105 generates control signals for the signal conditioning circuits. The control signals can be used for a variety of functions, such as controlling the gain and phase of transmitted and/or received signals to control beamforming.

Figure 4B:
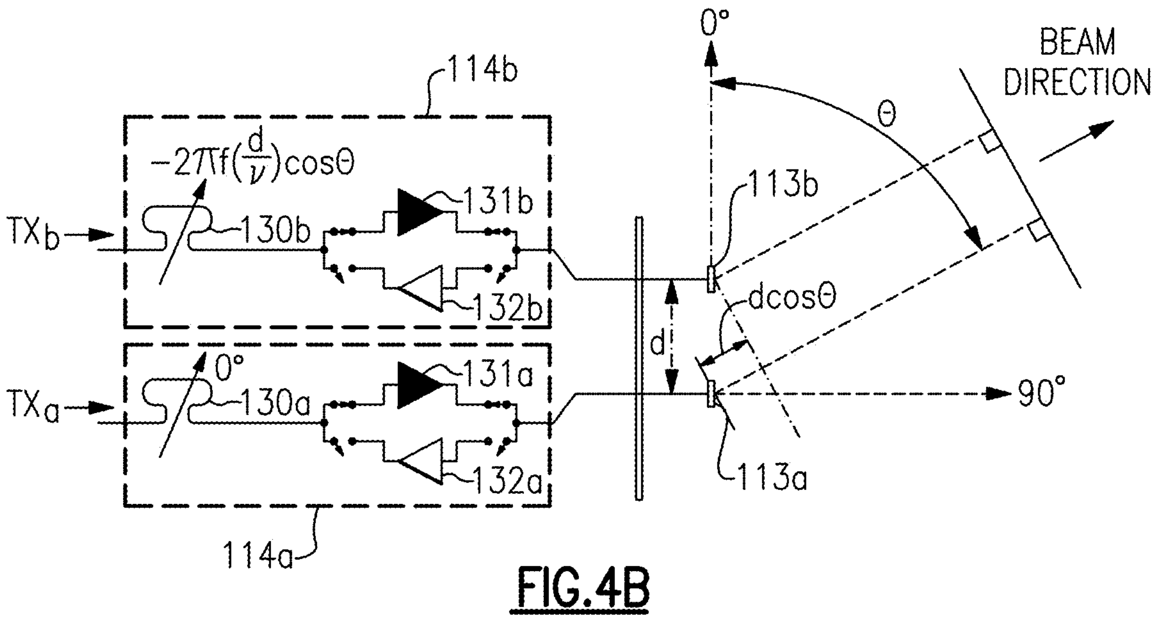
FIG. 4B is a schematic diagram of one example of beamforming to provide a transmit beam.

FIG. 4B is a schematic diagram of one example of beamforming to provide a transmit beam. FIG. 4B illustrates a portion of a communication system including a first signal conditioning circuit 114*a*, a second signal conditioning circuit 114*b*, a first antenna element 113*a*, and a second antenna element 113*b*.

Although illustrated as included two antenna elements and two signal conditioning circuits, a communication system can include additional antenna elements and/or signal conditioning circuits. For example, FIG. 4B illustrates one embodiment of a portion of the communication system 110 of FIG. 4A.

The first signal conditioning circuit 114*a* includes a first phase shifter 130*a*, a first power amplifier 131*a*, a first low noise amplifier (LNA) 132*a*, and switches for controlling selection of the power amplifier 131*a* or LNA 132*a*. Additionally, the second signal conditioning circuit 114*b* includes a second phase shifter 130*b*, a second power amplifier 131*b*, a second LNA 132*b*, and switches for controlling selection of the power amplifier 131*b* or LNA 132*b*.

Although one embodiment of signal conditioning circuits is shown, other implementations of signal conditioning circuits are possible. For instance, in one example, a signal conditioning circuit includes one or more band filters, duplexers, and/or other components.

In the illustrated embodiment, the first antenna element 113*a* and the second antenna element 113*b* are separated by a distance d. Additionally, FIG. 4B has been annotated with an angle Θ, which in this example has a value of about 90° when the transmit beam direction is substantially perpendicular to a plane of the antenna array and a value of about 0° when the transmit beam direction is substantially parallel to the plane of the antenna array.

By controlling the relative phase of the transmit signals provided to the antenna elements 113*a*, 113*b*, a desired transmit beam angle Θ can be achieved. For example, when the first phase shifter 130*a* has a reference value of 0°, the second phase shifter 130*b* can be controlled to provide a phase shift of about $-2\pi f(d/v)\cos\Theta$ radians, where f is the fundamental frequency of the transmit signal, d is the distance between the antenna elements, v is the velocity of the radiated wave, and π is the mathematic constant pi.

In certain implementations, the distance d is implemented to be about ½λ, where λ is the wavelength of the fundamental component of the transmit signal. In such implementations, the second phase shifter 130*b* can be controlled to provide a phase shift of about $-\pi\cos\Theta$ radians to achieve a transmit beam angle Θ.

Accordingly, the relative phase of the phase shifters 130*a*, 130*b* can be controlled to provide transmit beamforming. In certain implementations, a baseband processor and/or a transceiver (for example, the transceiver 105 of FIG. 4A) controls phase values of one or more phase shifters and gain values of one or more controllable amplifiers to control beamforming.

Figure 4C:
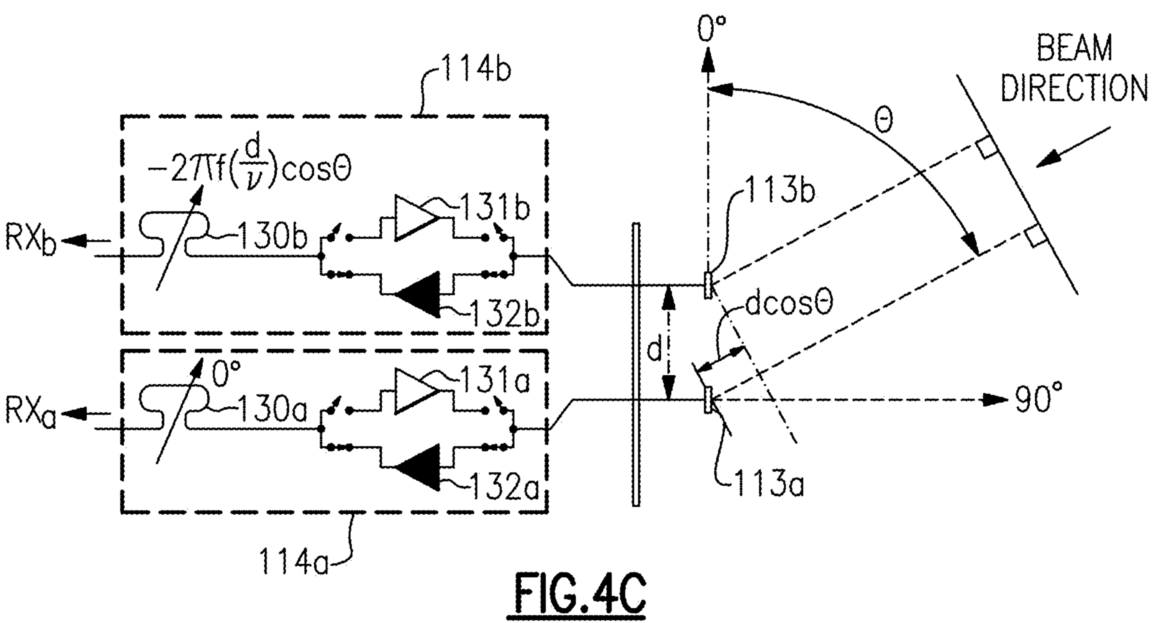
FIG. 4C is a schematic diagram of one example of beamforming to provide a receive beam.

FIG. 4C is a schematic diagram of one example of beamforming to provide a receive beam. FIG. 4C is similar to FIG. 4B, except that FIG. 4C illustrates beamforming in the context of a receive beam rather than a transmit beam.

As shown in FIG. 4C, a relative phase difference between the first phase shifter 130*a* and the second phase shifter 130*b* can be selected to about equal to $-2\pi f(d/v)\cos\Theta$ radians to achieve a desired receive beam angle Θ. In implementations in which the distance d corresponds to about ½λ, the phase difference can be selected to about equal to $-\pi\cos\Theta$ radians to achieve a receive beam angle Θ.

Although various equations for phase values to provide beamforming have been provided, other phase selection values are possible, such as phase values selected based on implementation of an antenna array, implementation of signal conditioning circuits, and/or a radio environment.

Figure 5:
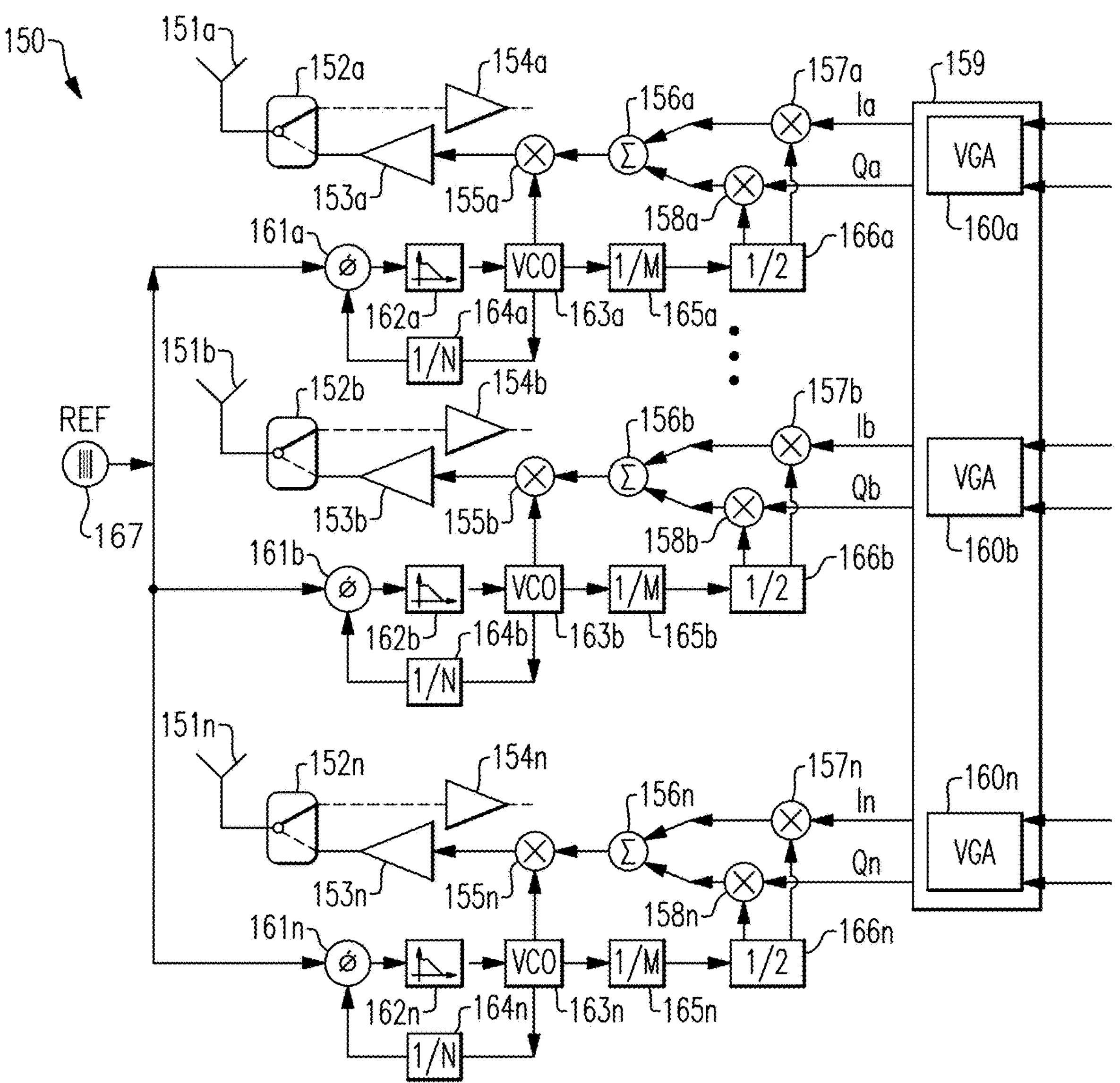
FIG. 5 is a schematic diagram of a communication system according to another embodiment.

FIG. 5 is a schematic diagram of a communication system 150 according to another embodiment. The communication system 150 includes antennas 151*a*, 151*b*, . . . 151*n*, transmit/receive (T/R) switches 152*a*, 152*b*, . . . 152*n*, power amplifiers 153*a*, 153*b*, . . . 153*n*, low noise amplifiers 154*a*, 154*b*, . . . 154*n*, intermediate frequency (IF) to RF mixers 155*a*, 155*b*, . . . 155*n*, I/Q combiners 156*a*, 156*b*, . . . 156*n*, I-path mixers 157*a*, 157*b*, . . . 157*n*, Q-path mixers 158*a*, 158*b*, . . . 158*n*, a controllable amplification circuit 159 (including variable gain amplifiers 160*a*, 160*b*, . . . 160*n*), phase detectors 161*a*, 161*b*, . . . 161*n*, filters 162*a*, 162*b*, . . . 162*n*, voltage controlled oscillators (VCOs) 163*a*, 163*b*, . . . 163*n*, feedback dividers 164*a*, 164*b*, . . . 164*n*, clock dividers 165*a*, 165*b*, . . . 165*n*, I/Q dividers 166*a*, 166*b*, . . . 166*n*, and a clock signal reference 167.

The communication system 150 of FIG. 5 depicts another example of RF circuitry that can be included in channels of an RF system, such as a mobile phone communicating using 5G FR2. In this example, multiple frequency upconversions are performed on signals to be transmitted. One example of generating clock signals used for providing frequency upconversion (by controlling the depicted mixers) is shown.

In certain implementations, phase shifters are included for providing phase shifting for beamforming. The VGAs 160*a*, 160*b*, . . . 160*n* can be used at least in part to achieve gain settings for beamforming.

Examples of Power Detection Systems

In certain embodiments herein, a power detection system includes a power amplifier, a directional coupler connected to an output of the power amplifier, and a power detector that generates a differential power detection signal based on a single-ended radio frequency input signal received from the directional coupler. The differential power detection signal indicates an output power of the power amplifier, for example, a root mean square (RMS) output power.

The power detector can exhibit a number of desirable properties. In a first example, the power detector provides very high RF power precision, for example, +/−0.13 dB for band n262 (45 GHz). In a second example, the power detector provides high modulation bandwidth response, for example, 400 MHz with +/−0.25 dB precision and/or 1 GHz for noncontiguous carrier aggregation with +/−0.45 dB precision.

Achieving such power detector bandwidth and precision allows the power detector to be used for a number of applications including, but not limited to, calibration for envelope tracking without needing to use an observation receiver. For example, when operating using FR2, an observation receiver can be difficult to implement and/or consume a large amount of power to capture observations of millimeter wave spectrum.

However, for envelope tracking delay calibration, the bandwidth and precision of the power detector allows the use of a multi-tone signal and correlation method in which an output of the detector is used for calibration. This in turn enables fast response using automatic test equipment (ATE) due to a use of baseband measurements.

The power detection and calibration schemes herein can be used in a wide variety of applications including, but not limited to, 5G FR2 cellular applications. Table 1 below depicts various examples of 5G FR2 frequency bands that can be used in accordance with the power detection and calibration schemes herein.

TABLE 1

| 5G Frequency Band | Band Duplex Type | UL/DL Low [MHz] | UL/DL High [MHz] |
|---|---|---|---|
| n257 | TDD | 26500 | 29500 |
| n258 | TDD | 24250 | 27500 |
| n259 | TDD | 39500 | 43500 |
| n260 | TDD | 37000 | 40000 |
| n261 | TDD | 27500 | 28350 |
| n262 | TDD | 47200 | 48200 |
| n263 (unlicensed) | TDD | 57000 | 71000 |

Figure 6:
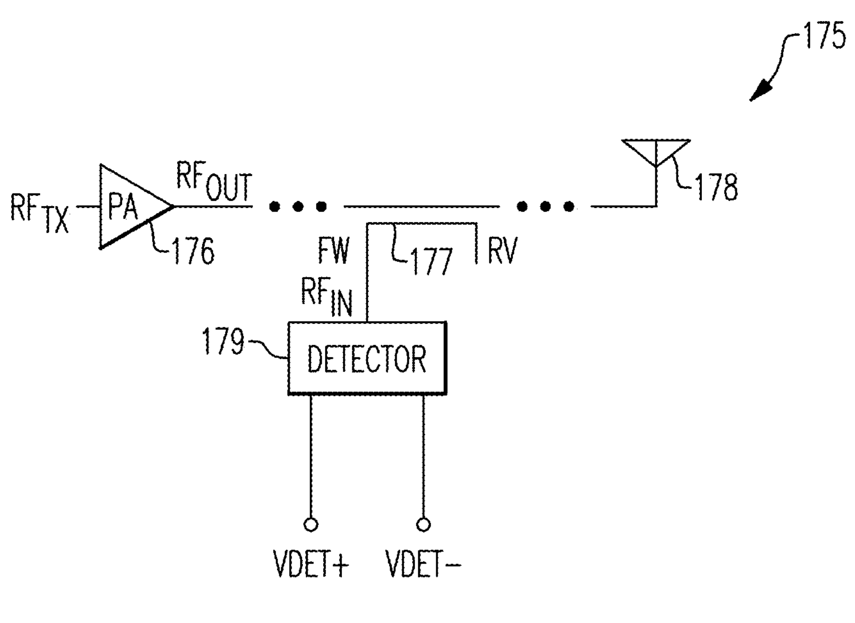
FIG. 6 is a schematic diagram of a power detection system according to one embodiment.

FIG. 6 is a schematic diagram of a power detection system 175 according to one embodiment. The power detection system 175 includes a power amplifier 176, a directional coupler 177, an antenna 178, and a power detector 179.

The power amplifier 176 amplifies an RF transmit signal $RF_{TX}$ to generate an RF output signal $RF_{OUT}$ that is provided along an RF signal path to the antenna 178 for wireless transmission. As shown in FIG. 6, the directional coupler 177 is connected along the RF signal path and operates to sense the RF output signal $RF_{OUT}$ to generate a single-ended RF input signal $RF_{IN}$ for the power detector 179. In this example, the single-ended RF input signal $RF_{IN}$ indicates a forward power (FW) to the antenna 178.

The power detector 179 generates a differential power detection signal VDET+, VDET− based on the single-ended radio frequency input signal $RF_{IN}$ from the directional coupler. The differential power detection signal VDET+, VDET− indicates an output power of the power amplifier 176, for example, RMS output power.

The differential power detection signal VDET+, VDET− can be subsequently processed in a wide variety of ways including, but not limited to, multiplexed, amplified/buffered, converted to a single-ended detection signal, and/or processed using linearization circuit(s).

Figure 7:
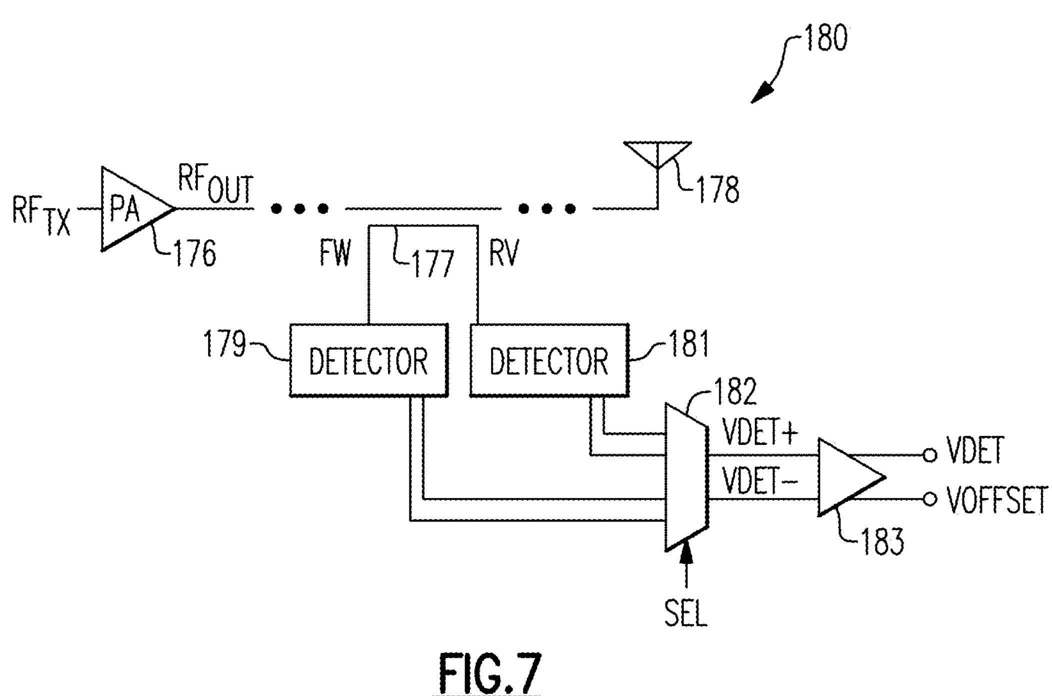
FIG. 7 is a schematic diagram of a power detection system according to another embodiment.

FIG. 7 is a schematic diagram of a power detection system 180 according to another embodiment. The power detection system 180 includes a power amplifier 176, a directional coupler 177, an antenna 178, a first power detector 179, a second power detector 181, a multiplexer 182, and an amplifier 183.

Figure 8:
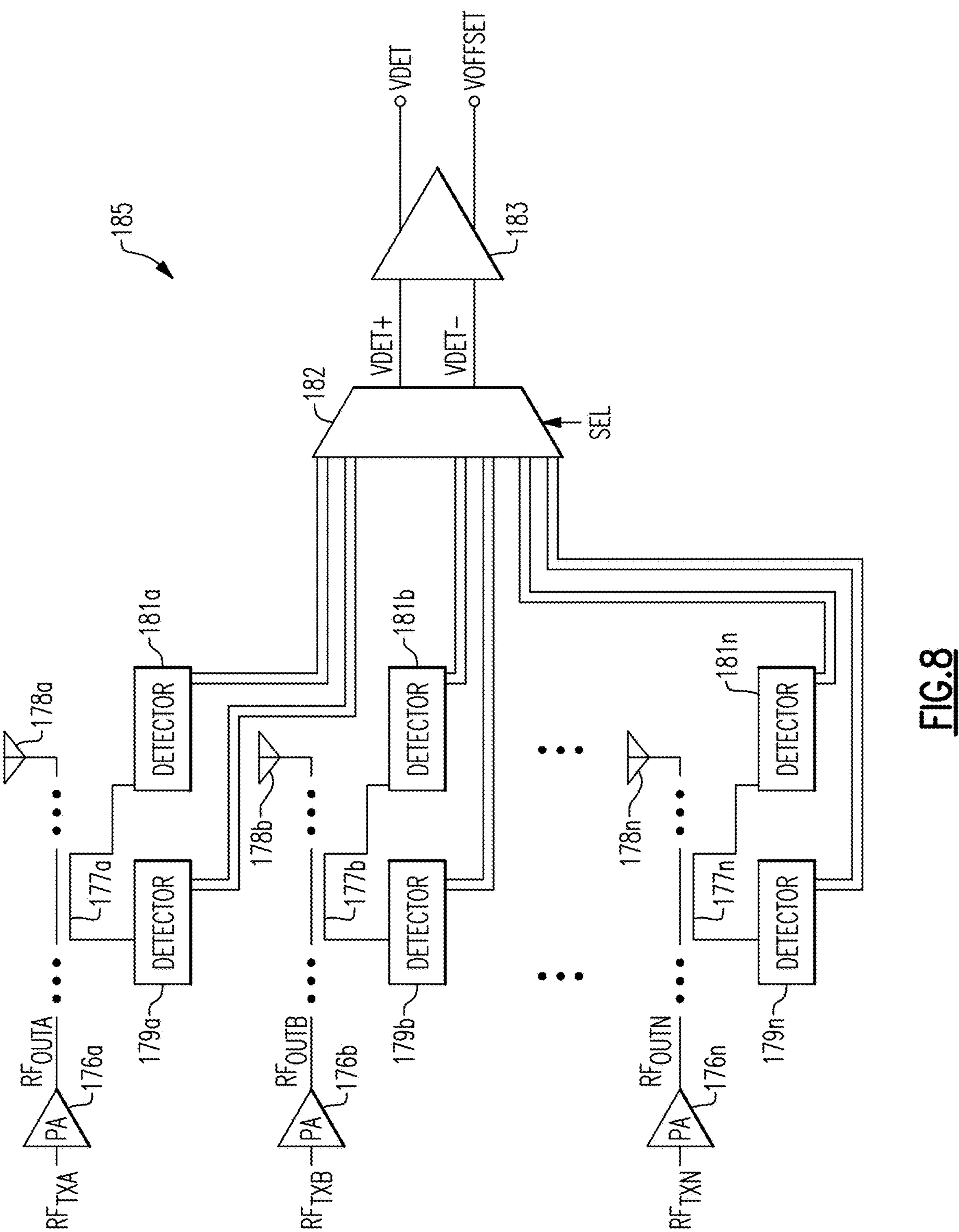
FIG. 8 is a schematic diagram of a power detection system according to another embodiment.

In comparison to the power detection system 175 of FIG. 6, the power detection system 180 of FIG. 8 includes the first power detector 179 for generating a first differential power detection signal based on a forward power (FW) to the antenna 178 and the second power detector 181 for generating a second differential power detection signal based on a reverse power (RV) to the antenna 179. Additionally, the multiplexer 182 outputs a selected differential power detection signal VDET+, VDET− based on a state of a selection signal SEL, which in certain implementations is generated by a baseband processor and/or transceiver. The selected differential power detection signal VDET+, VDET− is provided to the amplifier 183, which converts the selected differential power detection signal VDET+, VDET− to a single-ended power detection signal VDET referenced to an offset voltage VOFFSET.

By including, the amplifier 183, signal buffering (which can include gain) and/or differential to single-ended conversion can be provided as desired for a particular application.

Furthermore, including the multiplexer 182 aids in performing observations using reduced hardware resources. Additionally, the selection of the power detector can be changed over time to observe forward power or reverse power as desired.

FIG. 8 is a schematic diagram of a power detection system 185 according to another embodiment. The power detection system 185 includes power amplifiers 176*a*, 176*b*, . . . 176*n* that amplify RF transmit signals $RF_{TXA}$, $RF_{TXB}$, . . . $RF_{TXN}$, respectively, to generate RF transmit signals $RF_{OUTA}$, $RF_{OUTB}$, . . . $RF_{OUTN}$ for antennas 178*a*, 178*b*, . . . 178*n*. The power detection system 185 further includes directional couplers 177*a*, 177*b*, . . . 177*n* connected to the outputs of the power amplifiers 176*a*, 176*b*, . . . 176*n*. Additionally, the power detection system 185 includes first power detectors 179*a*, 179*b*, . . . 179*n* for measuring forward power, second power detectors 181*a*, 181*b*, . . . 181*n* for measuring reverse power, a multiplexer 182, and an amplifier 183.

In comparison to the power detection system 180 of FIG. 7, the power detection system 185 of FIG. 8 multiplexes differential power detection signals generated from multiple power amplifiers. For example, the power amplifiers 176*a*, 176*b*, . . . 176*n* can correspond to power amplifiers associated with different signal conditioning circuits in a beamforming application.

By multiplexing forward and/or reverse power detectors associated with multiple power amplifiers, a further reduction in hardware can be achieved.

Figure 9:
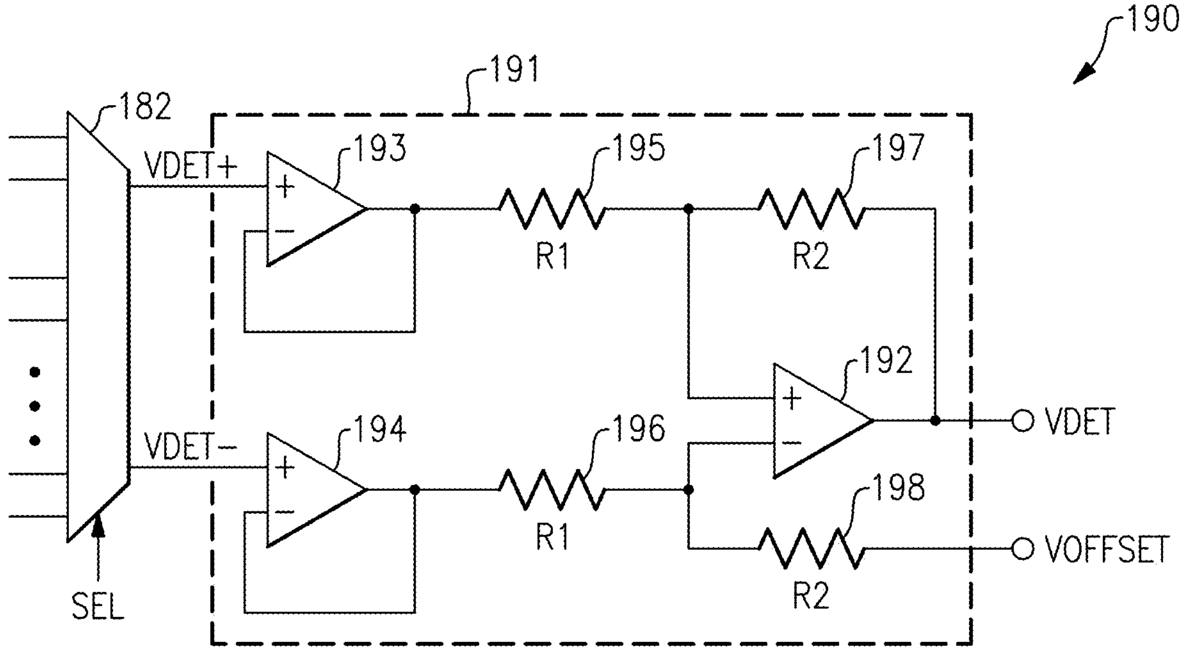
FIG. 9 is a schematic diagram of one embodiment of multiplexing and amplification circuitry for a power detection system.

FIG. 9 is a schematic diagram of one embodiment of multiplexing and amplification circuitry 190 for a power detection system. The multiplexing and amplification circuitry 190 includes a multiplexer 182 and an amplifier 191.

The multiplexer 182 outputs a selected differential power detection signal VDET+, VDET− based on choosing from among two or more differential power detection signals received from different power detectors. Such differential power detection signals can be from forward and reverse power detectors and/or different power amplifier channels (for example, different power amplifiers in a beamforming application).

In the illustrated embodiment, the amplifier 191 includes an output amplification stage 192, a first input amplification stage 193, a second input amplification stage 194, a first resistor 195 (of nominal resistance R1), a second resistor 196 (of nominal resistance R1), a third resistor 197 (of nominal resistance R2), and a fourth resistor 198 (of nominal resistance R2).

The amplifier 192 provides gain based on a ratio of resistance R2 to resistance R1. The amplifier 192 also converts the selected differential power detection signal VDET+, VDET− to a single-ended power detection signal VDET that is referenced to an offset voltage VOFFSET.

Although one example of multiplexing and amplifier circuitry is shown, the power detection systems herein can operate without multiplexing and amplification and/or with different implementations of multiplexing and amplifier circuitry.

Figure 10:
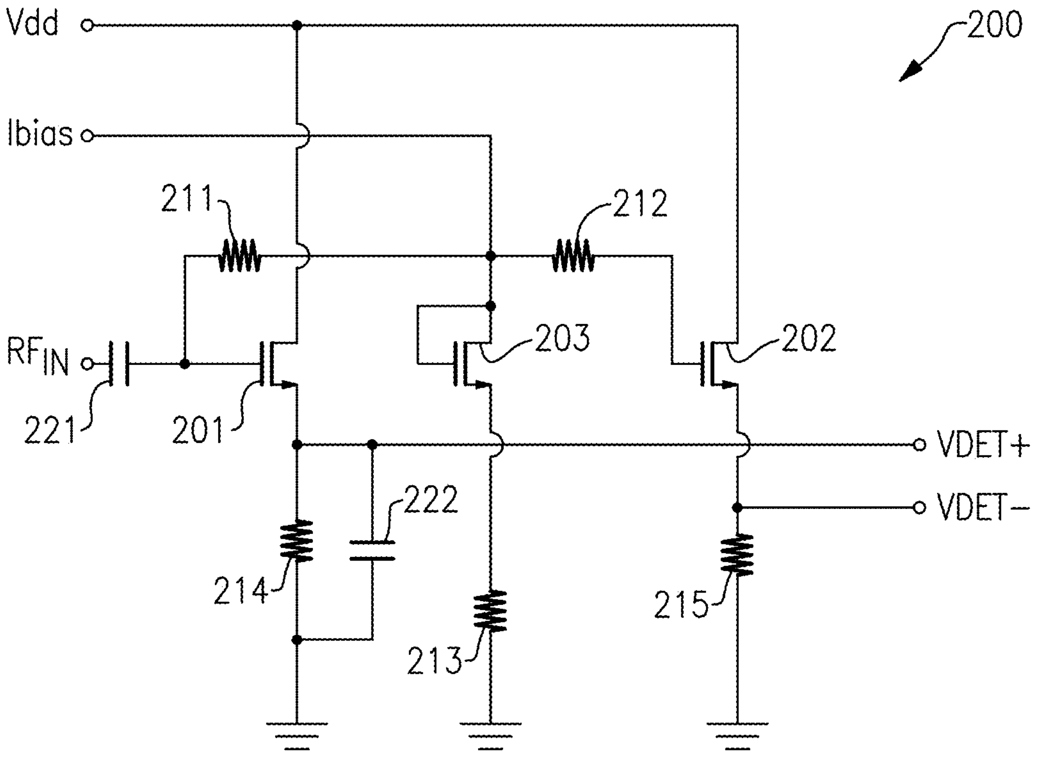
FIG. 10 is a schematic diagram of a power detector according to one embodiment.

FIG. 10 is a schematic diagram of a power detector 200 according to one embodiment.

The power detector 200 of FIG. 10 illustrates one embodiment for of a power detector for detecting the power of an RF input signal from a directional coupler. In this example, the power detector 200 is implemented as an RMS detector. However, the teachings herein are applicable to power detectors implemented in other ways.

With continuing reference to FIG. 10, the power detector 200 receives an RF input signal $RF_{IN}$ from a directional coupler, and processes the RF input signal $RF_{IN}$ to generate a differential power detection signal corresponding to a difference between a non-inverted power detection signal VDET+ and an inverted power detection signal VDET−.

The power detector 200 includes a first detection n-type field effect transistor (NFET) 201, a second detection NFET 202, a bias NFET 203, a first biasing resistor 211, a second biasing resistor 212, a third biasing resistor 213, a first detection resistor 214, a second detection resistor 215, an input capacitor 221, and a filter capacitor 222.

The input capacitor 221 couples the RF input signal $RF_{IN}$ to a gate of the first detection NFET 201 while providing DC voltage blocking. The first biasing resistor 211 and the second biasing resistor 212 control the DC bias voltages at the gates of the first detection NFET 201 and the second detection NFET 202, respectively. The DC bias voltage level is based on a magnitude of a bias current Ibias provided through the bias NFET 203 and the third bias resistor 213. A supply voltage Vdd is provided to the drains of the first detection NFET 201 and the second detection NFET 202.

The current through the first detection NFET 203 and the first detection resistor 214 changes in relation to the RF input signal $RF_{IN}$. Additionally, the filter capacitor 222 operates to filter the voltage across the first detection resistor 214. Thus, the non-inverted power detection signal VDET+ changes with the RF input signal $RF_{IN}$. The non-inverted power detection signal VDET+ also includes a DC component that is based on DC biasing, including for example, a magnitude of the bias current Ibias. To compensate for DC biasing, the second detection NFET 202 the second detection resistor 215 are used to generate the inverted power detection signal VDET−, which has a DC component that tracks the DC component of the non-inverted power detection signal VDET+.

By using differential signaling, a power detection signal that changes with an RMS value of the RF input signal $RF_{IN}$ is provided, while compensating or correction for a DC bias offset or error.

In the illustrated embodiment, the power detector 200 includes the first detection resistor 214 and the filter capacitor 222, which serve to control the bandwidth of RMS detection. In certain implementations, at least one of the first detection resistor 214 or the filter capacitor 222 is controllable to provide flexibility in selecting an RMS detector bandwidth desired for a particular application and/or to compensate for process, voltage, and/or temperature (PVT) variation.

Figure 11:
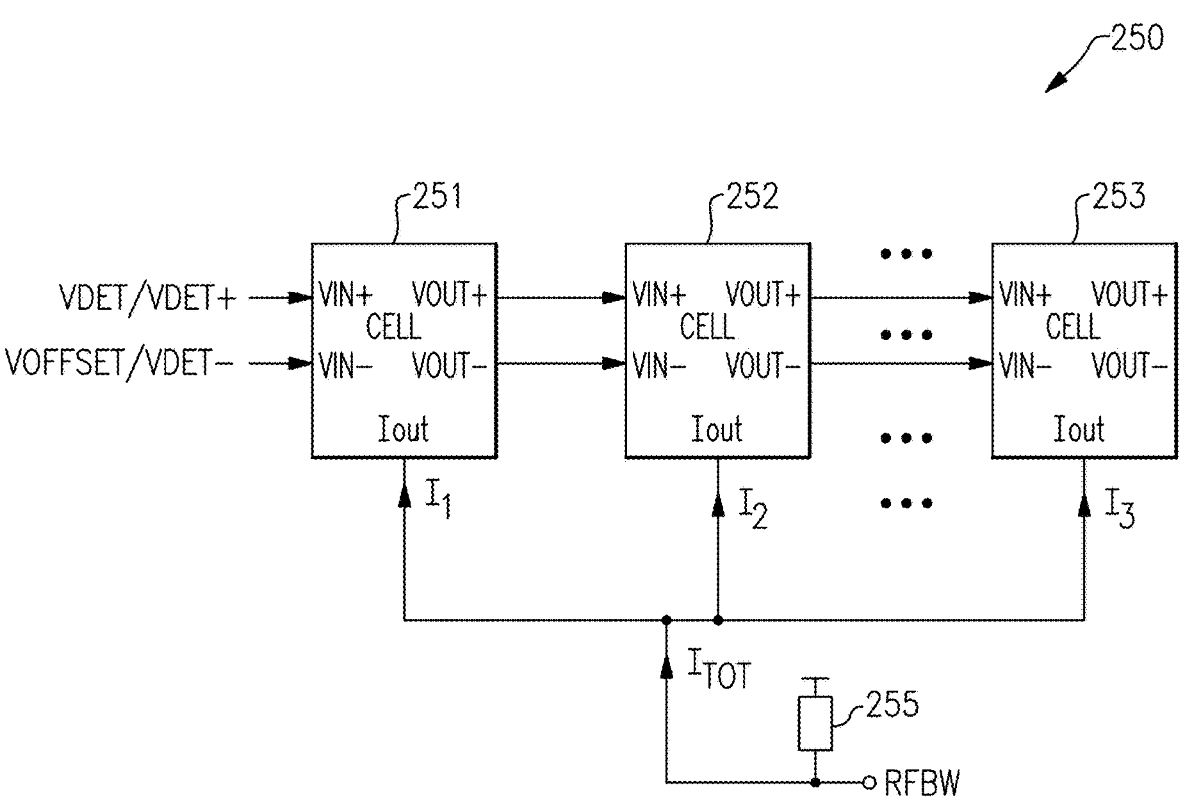
FIG. 11 is a schematic diagram of a detection signal linearization circuit according to one embodiment.

FIG. 11 is a schematic diagram of a detection signal linearization circuit 250 according to one embodiment.

The detection signal linearization circuit 250 of FIG. 11 illustrates one embodiment of linearization circuitry for enhancing the performance of a power detector. However, the teachings herein are applicable to power detectors implemented in a wide variety of ways, including power detectors implemented without linearization. Accordingly, other implementations are possible.

The detection signal linearization circuit 250 is used to generate a linearized RF power detection signal RFBW, which changes in relation to the detected power indicated by an input differential power detection signal (VDET+, VDET−) or a single-ended power detection signal (VDET) referenced to an offset voltage (VOFF). Thus, linearization can be applied to single-ended or differential power detection signals.

For example, the input differential detection signal to the detection signal linearization circuit 250 can correspond to the direct differential output of a power detector (for example, the power detector 170 of FIG. 6), or to the output of an amplifier after multiplexing (for example, as shown in FIGS. 7, 8, or 9). The detection signal linearization circuit 250 can serve to linearize the detection signal to aid in processing by downstream circuitry (for instance, an ADC of a receiver).

The detection signal linearization circuit 250 includes a first converter cell 251, a second converter cell 252, and a third converter cell 253 arranged in a cascade. As indicated by the ellipses, any desired number of converter cells can be included to achieve desired operating characteristics. In certain implementations, the detection signal linearization circuit 250 includes three or more cascaded converter cells.

As shown in FIG. 11, the first converter cell 251 generates a first current $I_1$ based on the input power detection signal (VDET+, VDET− or VDET, VOFFSET). Additionally, the first converter cell 251 provides a first down-shifted differential power detection signal to the second converter cell 252 based on down-shifting the voltage of the input power detection signal. The second converter cell 252 generates a second current $I_2$ based on the first down-shifted differential power detection signal. The second converter cell 252 further provides a second down-shifted differential power detection signal to the third converter cell 253 based on down-shifting the voltage of the first down-shifted differential power detection signal. Furthermore, the third converter cell 253 generates a third current $I_3$ based on the second down-shifted differential power detection signal. In the illustrated embodiment, the converter cells each include non-inverted input voltage VIN+, inverted input voltage VIN−, non-inverted output voltage VOUT+, inverted output voltage VOUT−, and output current Iout terminals.

As shown in FIG. 11, the currents from the converter cells 251-253 are summed to generate a total current $I_{TOT}$, which flows through the impedance 255 to generate the linearized RF power detection signal RFBW. In certain implementations, the impedance 255 is connected to a positive reference voltage, such as a power high supply voltage.

Figure 12:
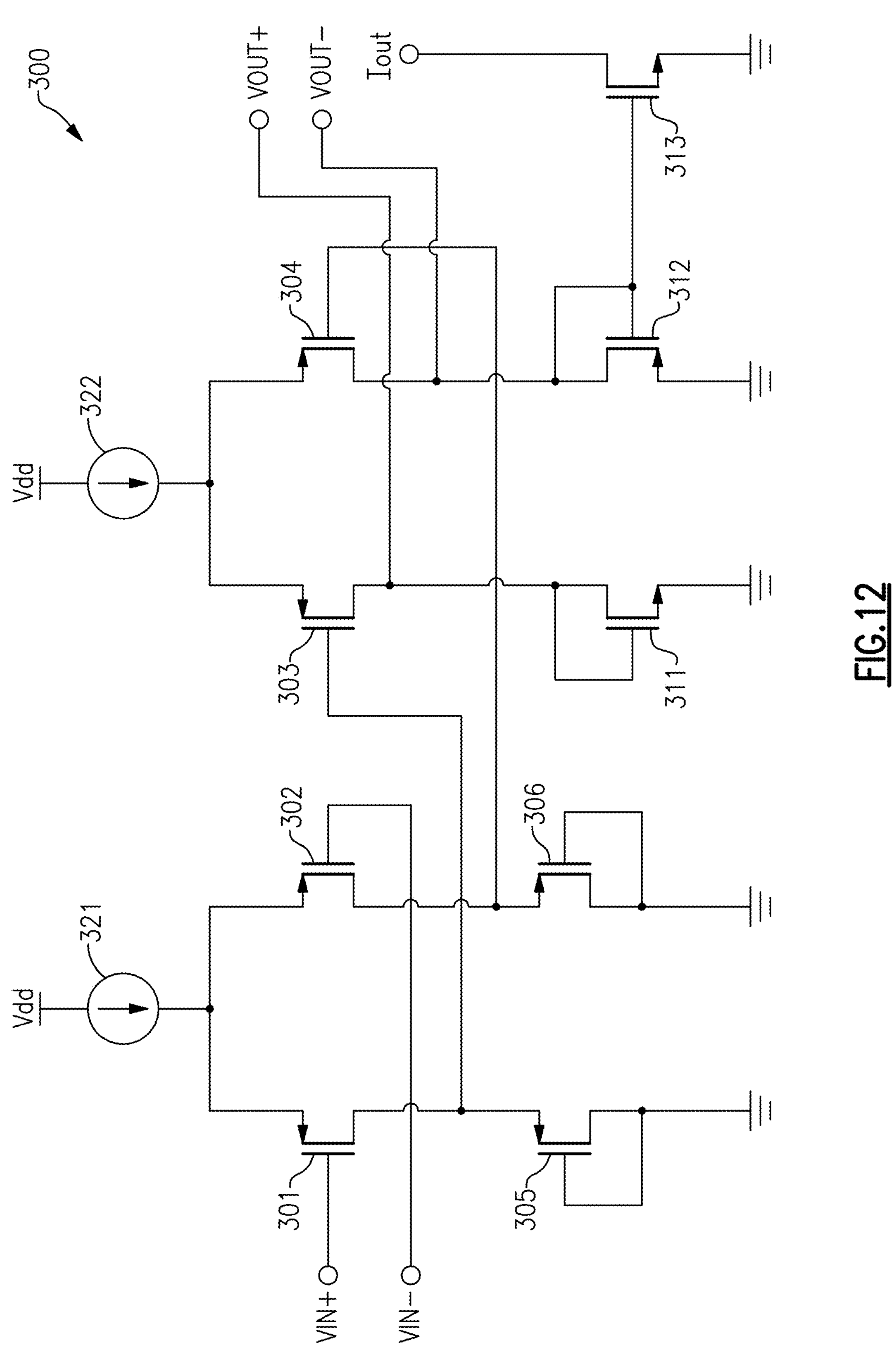
FIG. 12 is a schematic diagram of one embodiment of a converter cell for the detection signal linearization circuit of FIG. 11.

FIG. 12 is a schematic diagram of one embodiment of a converter cell 300 for the detection signal linearization circuit 250 of FIG. 11.

The converter cell 300 includes a first differential transistor pair including a first p-type field effect transistor (PFET) 301 and a second PFET 302, and a second differential transistor pair including a third PFET 303 and a fourth PFET 304. The converter cell 300 further includes a first load transistor pair including a fifth PFET 305 and a sixth PFET 306, and a second load transistor pair including a first NFET 311 and a second NFET 312. As shown in FIG. 12, the first load transistor pair serves as a load to the first differential transistor pair, and the second load transistor pair serves as a load to the second differential transistor pair.

The first differential transistor pair 301-302 amplifies a voltage difference between the differential input signal IN+, IN−. Additionally, the amplified voltage difference provided by the first differential transistor pair 301-302 is further amplified by the second differential transistor pair 303-304 to generate a differential output signal VOUT+, VOUT−.

The current through the second NFET 312 is mirrored using the mirror NFET 313 to generate an output current Iout for the converter cell 300.

Figure 13A:
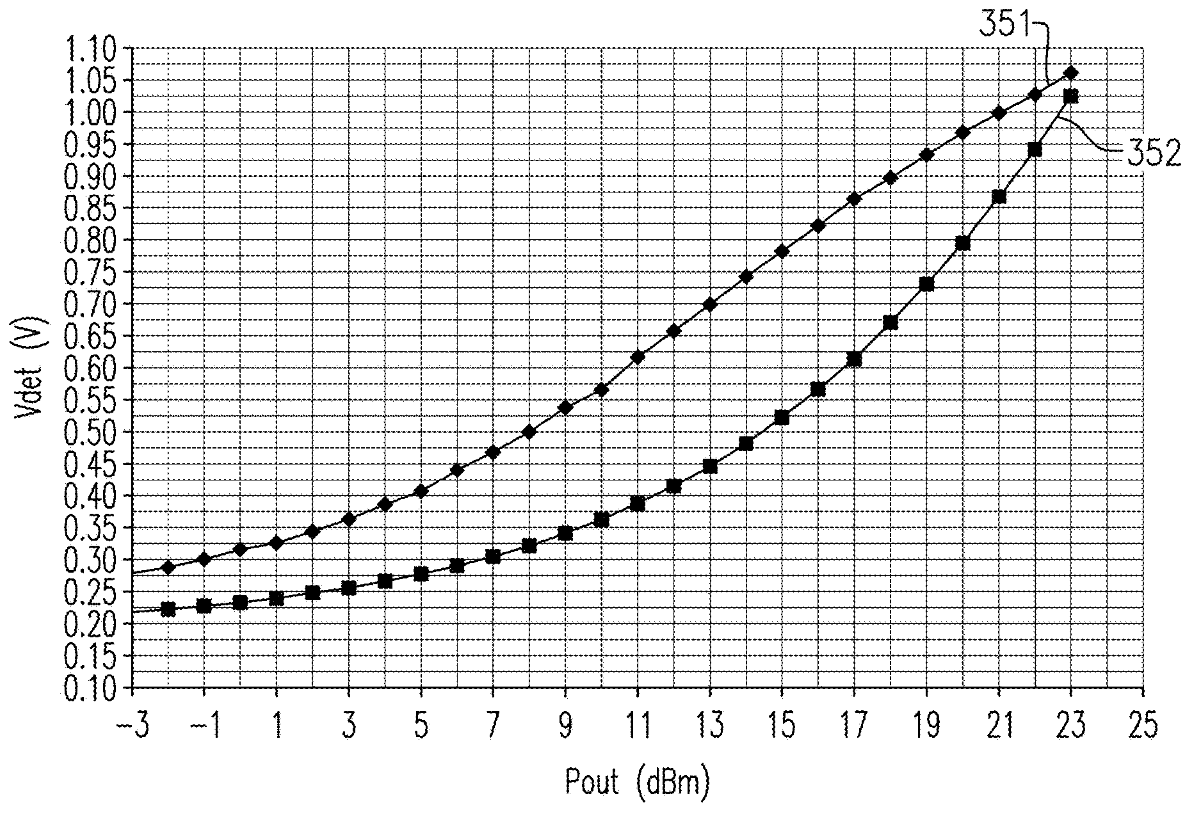
FIG. 13A is a graph of one example of power detector output versus power amplifier output power.

FIG. 13A is a graph of one example of power detector output versus power amplifier output power. The graph includes an x-axis of output power Pout (in dBm) of a power amplifier and a y-axis of detector output voltage Vdet (in V). The graph includes a first plot 351 for an I88_5180 signal and a second plot 352 for an I88_5905 signal.

Figure 13B:
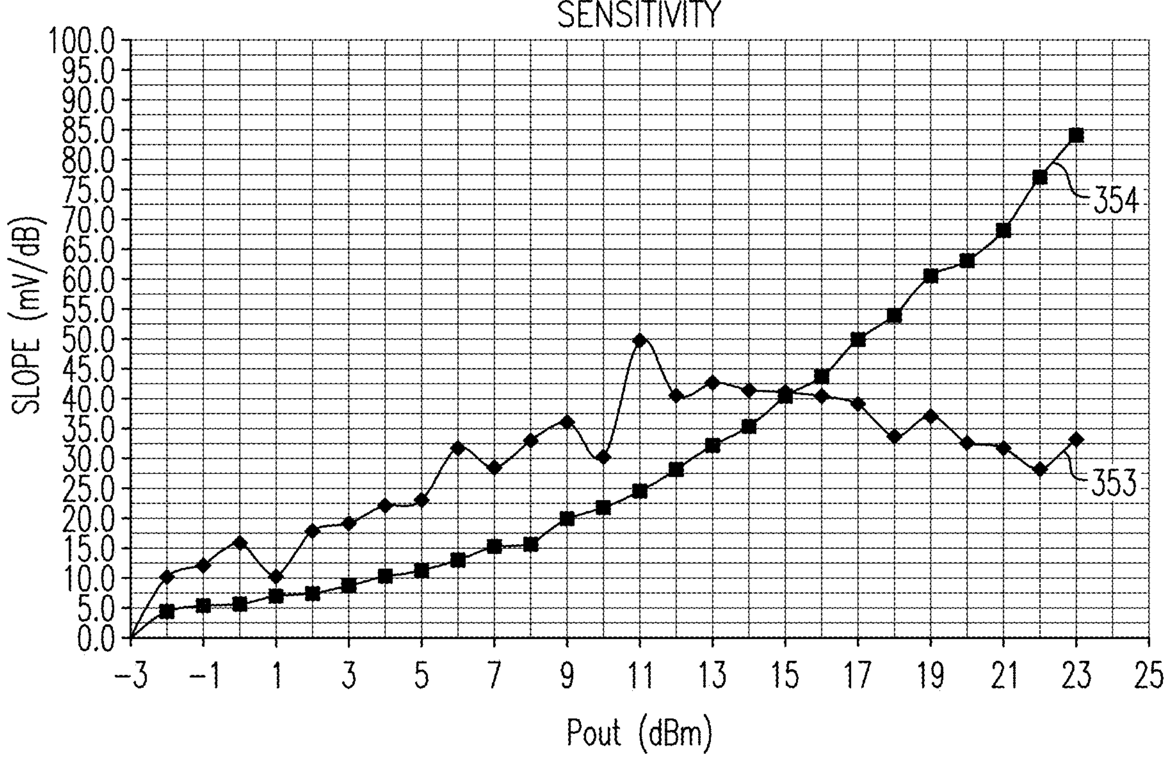
FIG. 13B is a graph of one example of power detector sensitivity versus power amplifier output power.

FIG. 13B is a graph of one example of power detector sensitivity versus power amplifier output power. The graph includes an x-axis of output power Pout (in dBm) of a power amplifier and a y-axis of slope (in mV per dB). The graph includes a first plot 353 for an I88_5180 signal and a second plot 354 for an I88_5905 signal.

Figure 13C:
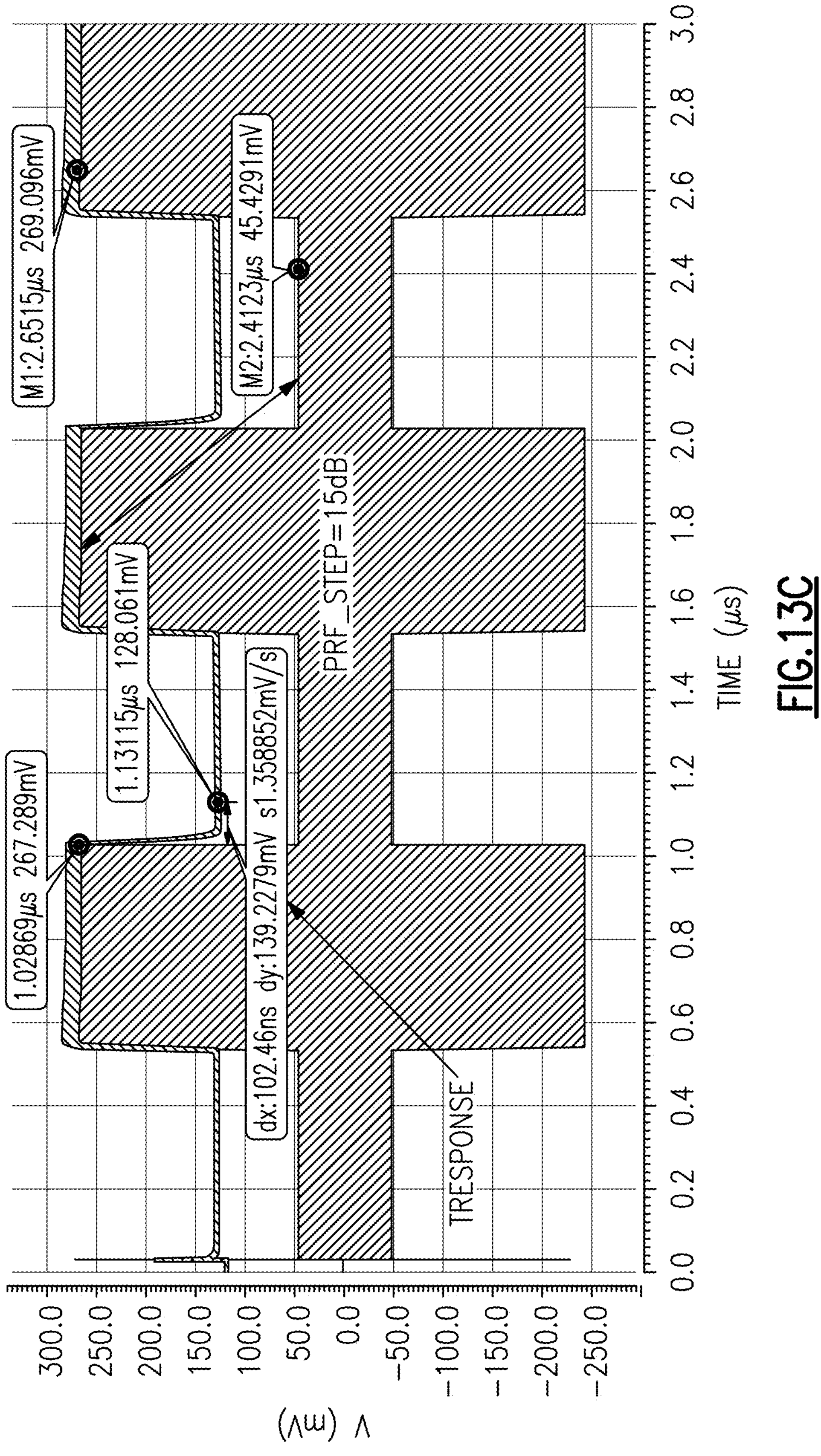
FIG. 13C is a graph of one example of transient response of a power detector.

FIG. 13C is a graph of one example of transient response of a power detector. The graph includes an x-axis of time (in microseconds) and a y-axis of voltage (in V).

A power detector's output is shown in response to changing RF signal power of +15 dBm. As shown in FIG. 13C, the power detector exhibits a fast transient response TRESPONSE. Thus, the power detector exhibits fast response for RF power steps and high modulation bandwidth.

Figure 13D:
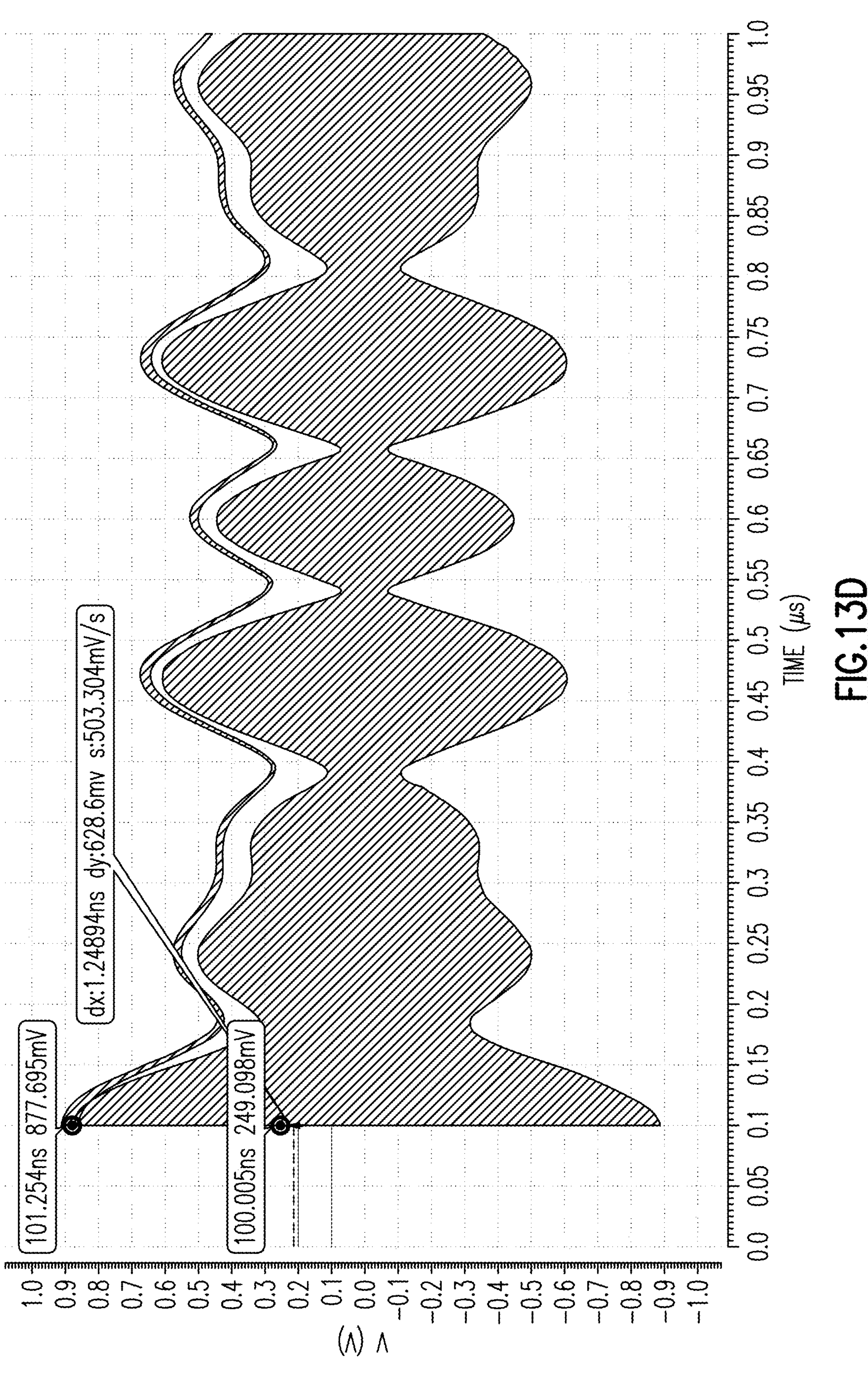
FIG. 13D is a graph of another example of transient response of a power detector.

FIG. 13D is a graph of another example of transient response of a power detector. The graph includes an x-axis of time (in microseconds) and a y-axis of voltage (in V).

A power detector's output is shown in response to an example of gradual changes in RF signal power.

Examples of Envelope Tracking Calibration

Envelope tracking (ET) is a technique that can be used to increase power added efficiency (PAE) of a power amplifier by efficiently controlling a voltage level of a power amplifier supply voltage in relation to an envelope of a radio frequency (RF) signal amplified by the power amplifier. Thus, when the envelope of the RF signal increases, the voltage supplied to the power amplifier can be increased. Likewise, when the envelope of the RF signal decreases, the voltage supplied to the power amplifier can be decreased to reduce power consumption.

Schemes are provided for aligning an envelope signal to an envelope tracker that controls the supply voltage of a power amplifier in relation to the envelope signal.

In certain embodiments, calibration is performed by providing an envelope signal with a peak along an envelope path, and by providing an RF signal with a first peak and a second peak to a power amplifier along an RF signal path. Additionally, an output of the power amplifier is observed used a directional coupler and a power detector to generate a power detection signal for a baseband receiver. The power detection signal includes a first peak and a second peak corresponding to the first peak and the second peak of the RF signal, and a delay between the envelope signal and the RF signal is controlled based on relative size of the peaks of the power detection signal to one another.

In certain implementations, the delay is controlled such that the peaks in the observation signal are of about equal size to one another. Additionally, the delay can be incremented or decremented until alignment is achieved to a desired accuracy. Thus, an accurate and a flexible mechanism is provided for aligning an envelope signal to an RF signal.

The power detector can be implemented in accordance with any of the embodiments herein.

Additionally, envelope alignment can be performed without any need for an observation receiver operating on observations at RF. For example, no mixer need be included in the observation path. Rather, the power detector outputs a baseband detection signal processed by a baseband receiver.

In certain implementations, a controllable delay circuit is programmed with a delay generated based on the calibration. For example, a controllable capacitor and/or other controllable delay circuit can have a setting selected based on the calibration. The setting can be controlled based on analog and/or digital signals. For instance, a front end system can include a memory and a controllable delay circuit that is programmed based on calibration data stored in the memory. In one example, the memory is a non-volatile memory programmed with data generated by a calibration sequence after manufacture (for example using ATE) or deployment in a communication system, such as a mobile device. In a second example, the memory is volatile and is programmed with the calibration data over a serial interface, for instance, after power up.

The calibration can also be used to control a delay of multiple components that operate based on the envelope signal.

Figure 14:
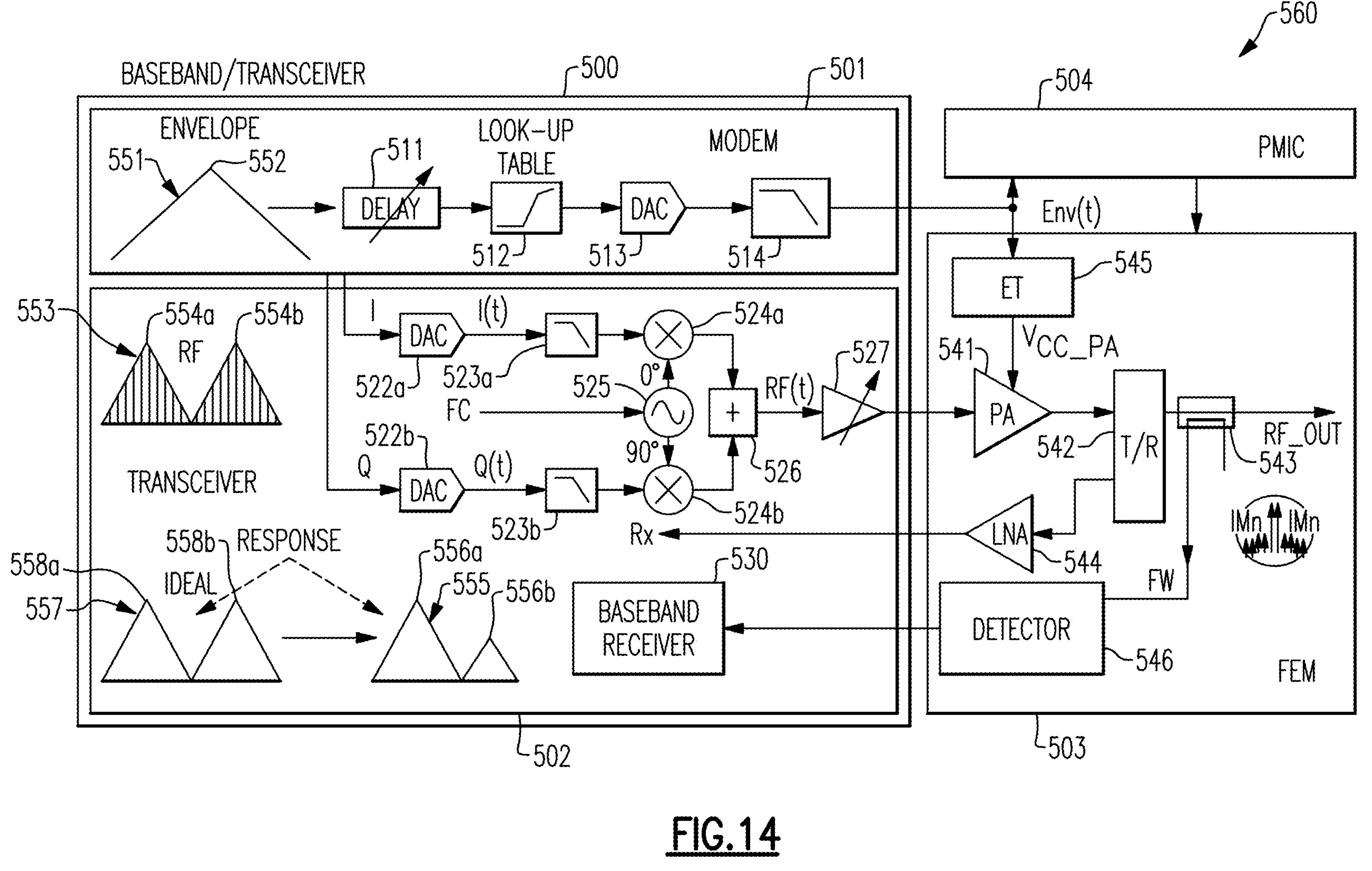
FIG. 14 is a schematic diagram of one embodiment of a calibration scheme for a communication system operating with envelope tracking.

FIG. 14 is a schematic diagram of one embodiment of a calibration scheme for a communication system 560 operating with envelope tracking. The communication system 560 includes a baseband system/transceiver 500, a front end module 503 and a power management integrated circuit (PMIC) 504.

In the illustrated embodiment, the baseband system/transceiver 500 includes a baseband modem 501, a transceiver 502, and a baseband receiver 530, which can be included as part of baseband modem 501 or the transceiver 502. The baseband modem 501 includes a controllable delay circuit 511, a look-up table 512, an envelope digital-to-analog converter (DAC) 513, and an envelope filter 514. The baseband modem 501 operates to generate an in-phase (I) signal and a quadrature-phase (Q) signal along with an envelope signal Env(t) indicating the envelope of the RF signal represented by the I signal and the Q signal. The controllable delay circuit 511 controls a delay of the envelope signal Env(t).

With continuing reference to FIG. 14, the transceiver 502 includes an I-path DAC 522*a*, a Q-path DAC 522*b*, an I-path baseband filter 523*a*, a Q-path baseband filter 523*b*, an I-path mixer 524*b*, a Q-path mixer 524*b*, a local oscillator 525, a combiner 526, and a controllable driver 527. The transceiver 502 processes the I signal and the Q signal to generate an RF signal RF(t) that is amplified by the controllable driver 527 and thereafter provided to the front end module 503.

The front end module 503 includes a power amplifier 541, a T/R switch 542, a directional coupler 543, a low noise amplifier (LNA) 544, an envelope tracker 545, and a power detector 546. The power detector 546 can be implemented in accordance with any of the embodiments herein.

The power amplifier 541 amplifies the RF signal from the transceiver 502 and provides an RF output signal RF_OUT by way of the T/R switch 542 and directional coupler 543.

The RF output signal RF_OUT is provided to an antenna (now shown in FIG. 14) for transmission.

The power amplifier supply voltage $V_{CC\_PA}$ of the power amplifier 541 is controlled by the envelope tracker 545 based on the envelope signal Env(t) from the baseband modem 501. The envelope signal Env(t) is also provide to the PMIC 504, which processes the envelope signal Env(t) to generate one or more regulated voltage for the front end module 503.

With continuing reference to FIG. 14, the directional coupler 543 senses the RF output signal RF_OUT to generate an RF input to the power detector 546. In this example, forward power (FW) is detected. However, other implementations reverse power (RV) or both reverse power and forward power are detected.

The power detector 546 provides a power detection signal to the baseband receiver 530 without a need for any observation mixers (for frequency downconversion) or observation receivers.

The delay of the controllable delay circuit 511 controls a relative delay or time difference between the envelope signal Env(t) and the RF signal RF(t). Thus, the delay of the controllable delay circuit 511 can be set to a value for aligning the RF signal and the power amplifier supply voltage $V_{CC\_PA}$ at the power amplifier 541.

The delay of a controllable delay circuit (for instance, the controllable delay circuit 511) can be calibrated in accordance with the teachings herein to align an RF signal to an envelope-controlled signal. For instance, an envelope-controlled supply voltage to a power amplifier can be aligned to an RF input signal to the power amplifier.

In the illustrated embodiment, the baseband modem 501 generates an envelope signal 551 by way of an envelope path to the envelope tracker 545. The envelope signal 551 includes a peak 552 and has a relatively low bandwidth. In one example, during calibration, the envelope signal 551 has a bandwidth of less than 1 MHz. Additionally, the baseband modem provides an RF signal 553 having a first peak 554*a* and a second peak 554*b* to the amplifier 541 by way of an RF signal path.

With continuing reference to FIG. 14, the power detection signal 555 from the power detector 546 includes a first peak 556*a* and a second peak 556*b*.

In certain implementations, the delay of the controllable delay circuit 511 is adjusted until the first peak 556*a* and the second peak 556*b* of the power detection signal 555 are substantially equal, corresponding to an ideal signal 557 having a first peak 558*a* and a second peak 558*b* that are about equal to one another.

Figure 15:
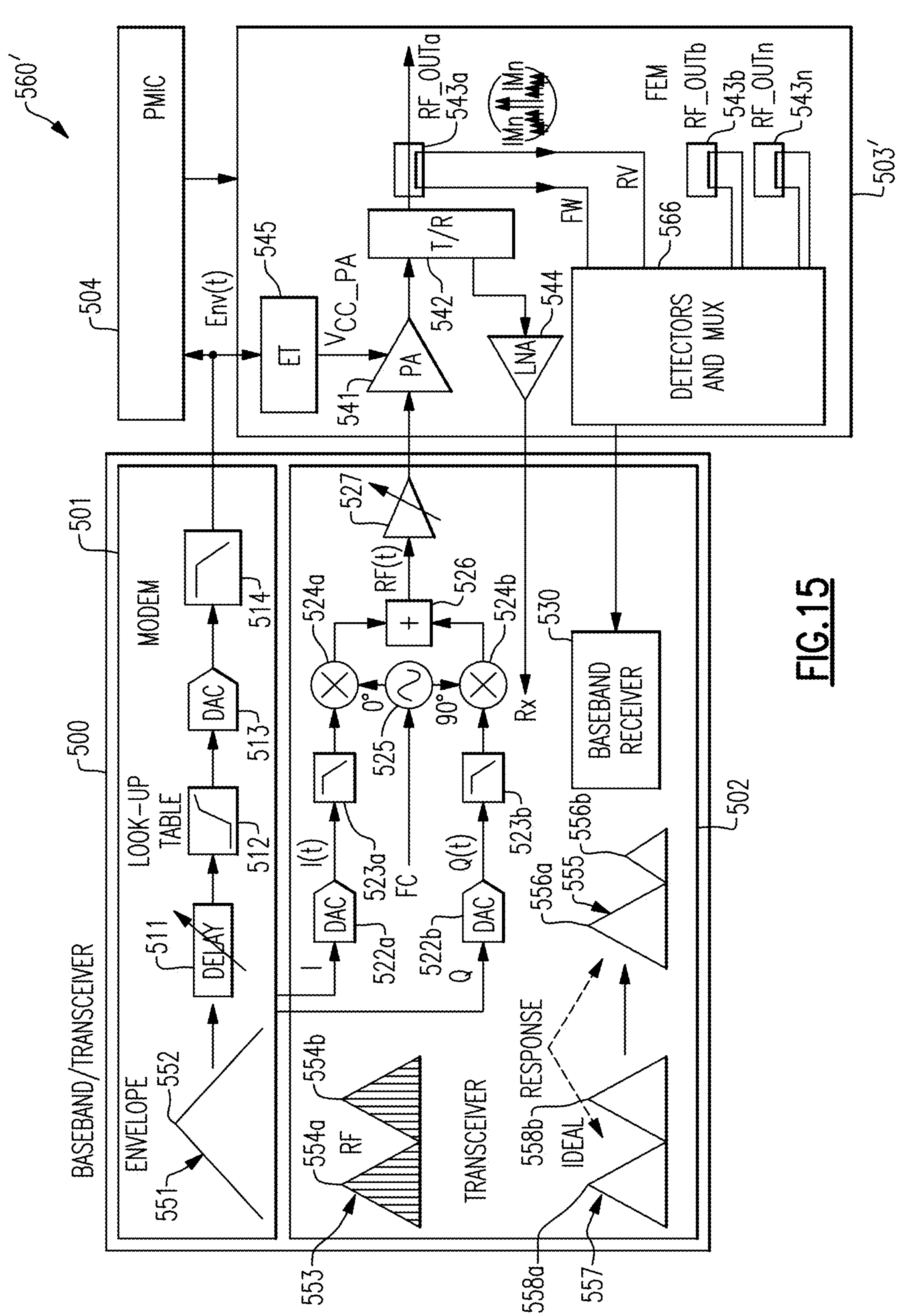
FIG. 15 is a schematic diagram of another embodiment of a calibration scheme for a communication system operating with envelope tracking.

FIG. 15 is a schematic diagram of another embodiment of a calibration scheme for a communication system 560' operating with envelope tracking. The communication system 560' includes a baseband system/transceiver 500, a front end module 503' and a power management integrated circuit (PMIC) 504.

Figure 16:
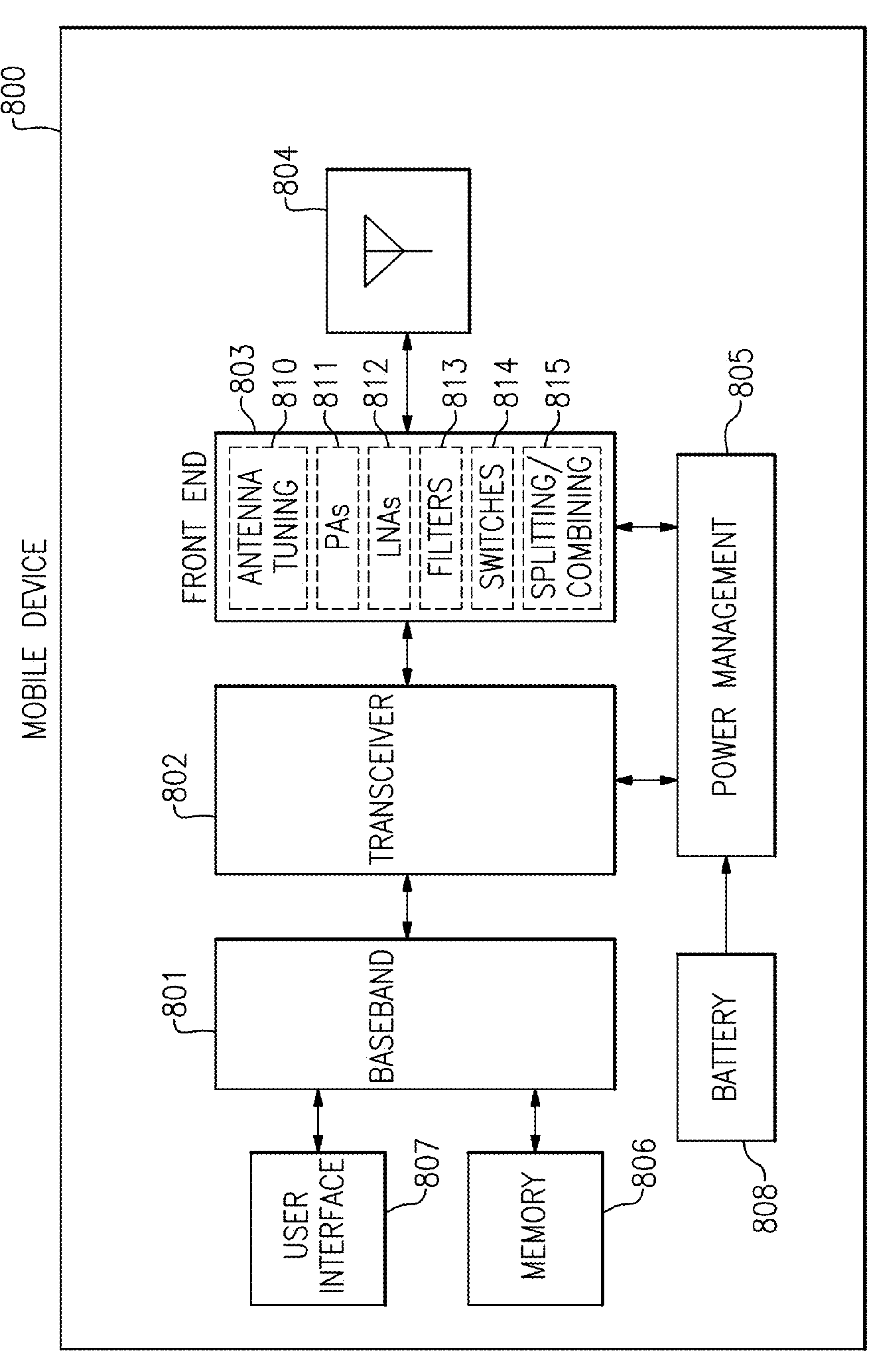
FIG. 16 is a schematic diagram of one embodiment of a mobile device.

In comparison to the communication system 560 of FIG. 15, the communication system 560' of FIG. 16 includes the front end system 503' implemented with RF signal paths for multiple power amplifiers. For example, the front end system 503' can include at least directional couplers 543*a*, 543*b*, . . . 543*n* associated with multiple power amplifiers. In certain implementations, the front end system 503' also includes a power amplifier and T/R switches associated with each of the depicted directional couplers 543*a*, 543*b*, . . . 543*n*.

In the illustrated embodiment, the front end system 503' includes multiple power detectors 566 implemented with multiplexing in accordance with the teachings herein. Thus, reduced component count and a shared baseband receiver 530 can be used.

FIG. 16 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 16 as the transceiver 802. In one example, separate components (for instance, separate circuits or dies) can be provided for handling certain types of RF signals.

The front end system 803 aids is conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 16, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 16, the power management system 805 receives a battery voltage from the battery 808. The battery 808 can be any suitable battery for use in the mobile device 800, including, for example, a lithium-ion battery.

Figure 17:
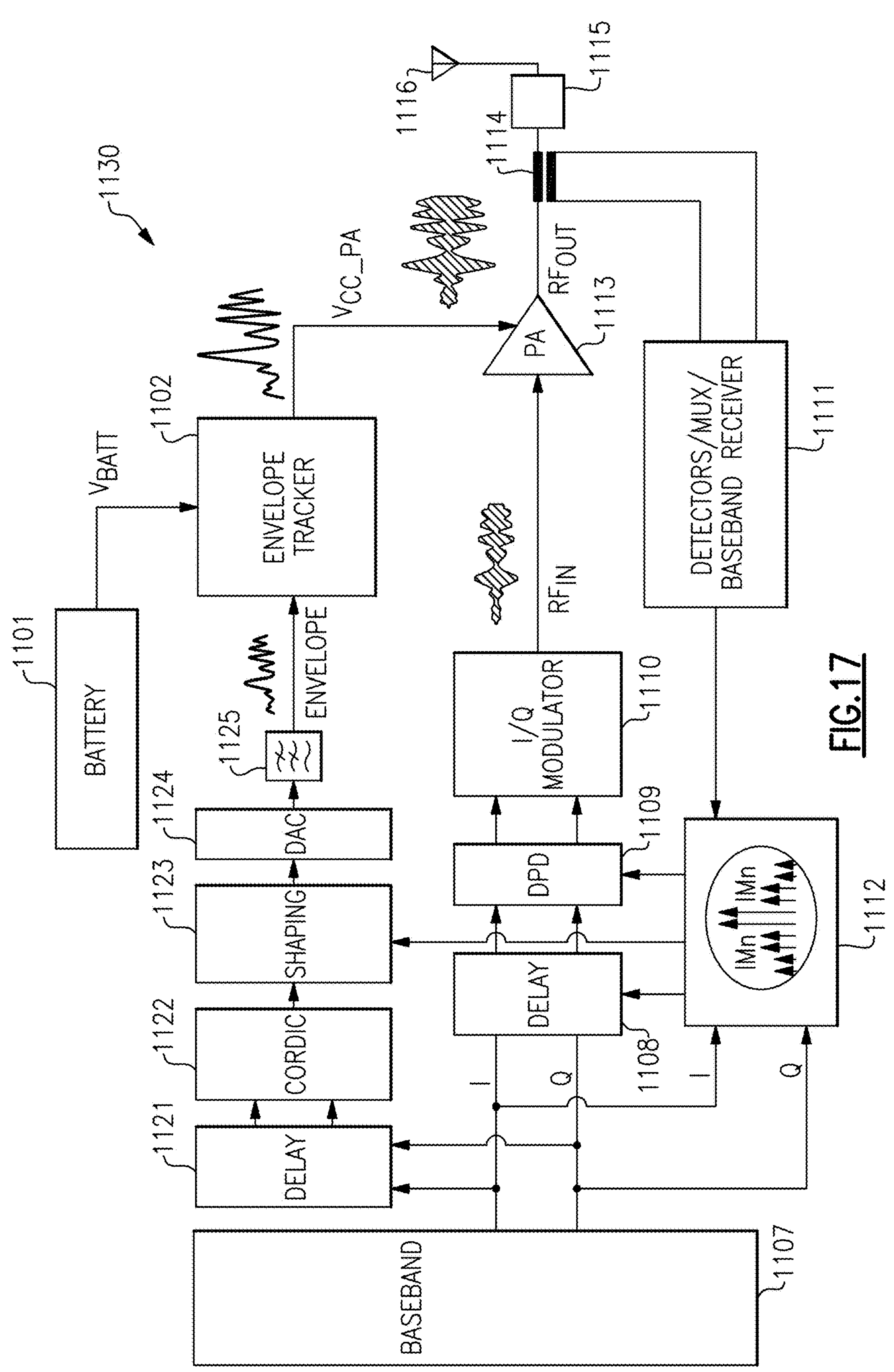
FIG. 17 is a schematic diagram of one embodiment of a communication system for transmitting RF signals.

FIG. 17 is a schematic diagram of one embodiment of a communication system 1130 for transmitting RF signals. The communication system 1130 includes a battery 1101, an envelope tracker 1102, a baseband processor 1107, a signal delay circuit 1108, a digital pre-distortion (DPD) circuit 1109, an I/Q modulator 1110, power detectors/multiplexer/baseband receiver circuitry 1111, an intermodulation detection circuit 1112, a power amplifier 1113, a directional coupler 1114, a duplexing and switching circuit 1115, an antenna 1116, an envelope delay circuit 1121, a coordinate rotation digital computation (CORDIC) circuit 1122, a shaping circuit 1123, a digital-to-analog converter 1124, and a reconstruction filter 1125.

The communication system 1130 of FIG. 17 illustrates one example of an RF system operating with a power amplifier supply voltage controlled using envelope tracking. However, envelope tracking systems can be implemented in a wide variety of ways.

The baseband processor 1107 operates to generate an I signal and a Q signal, which correspond to signal components of a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals are provided to the I/Q modulator 1110 in a digital format. The baseband processor 1107 can be any suitable processor configured to process a baseband signal. For instance, the baseband processor 1107 can include a digital signal processor, a microprocessor, a programmable core, or any combination thereof.

The signal delay circuit 1108 provides adjustable delay to the I and Q signals to aid in controlling relative alignment between the envelope signal and the RF signal $RF_{IN}$. The amount of delay provided by the signal delay circuit 1108 is controlled based on amount of intermodulation detected by the intermodulation detection circuit 1112.

The DPD circuit 1109 operates to provide digital shaping to the delayed I and Q signals from the signal delay circuit 1108 to generate digitally pre-distorted I and Q signals. In the illustrated embodiment, the pre-distortion provided by the DPD circuit 1109 is controlled based on amount of intermodulation detected by the intermodulation detection circuit 1112. The DPD circuit 1109 serves to reduce a distortion of the power amplifier 1113 and/or to increase the efficiency of the power amplifier 1113.

The I/Q modulator 1110 receives the digitally pre-distorted I and Q signals, which are processed to generate an RF signal $RF_{IN}$. For example, the I/Q modulator 1110 can include DACs configured to convert the digitally pre-distorted I and Q signals into an analog format, mixers for upconverting the analog I and Q signals to radio frequency, and a signal combiner for combining the upconverted I and Q signals into an RF signal suitable for amplification by the power amplifier 1113. In certain implementations, the I/Q modulator 1110 can include one or more filters configured to filter frequency content of signals processed therein.

The envelope delay circuit 1121 delays the I and Q signals from the baseband processor 1107. Additionally, the CORDIC circuit 1122 processes the delayed I and Q signals to generate a digital envelope signal representing an envelope of the RF signal $RF_{IN}$. Although FIG. 17 illustrates an implementation using the CORDIC circuit 1122, an envelope signal can be obtained in other ways.

The shaping circuit 1123 operates to shape the digital envelope signal to enhance the performance of the communication system 1130. In certain implementations, the shaping circuit 1123 includes a shaping table that maps each level of the digital envelope signal to a corresponding shaped envelope signal level. Envelope shaping can aid in controlling linearity, distortion, and/or efficiency of the power amplifier 1113.

In the illustrated embodiment, the shaped envelope signal is a digital signal that is converted by the DAC 1124 to an analog envelope signal. Additionally, the analog envelope signal is filtered by the reconstruction filter 1125 to generate an envelope signal suitable for use by the envelope tracker 1102. In certain implementations, the reconstruction filter 1125 includes a low pass filter.

With continuing reference to FIG. 17, the envelope tracker 1102 receives the envelope signal from the reconstruction filter 1125 and a battery voltage $V_{BATT}$ from the battery 1101, and uses the envelope signal to generate a power amplifier supply voltage $V_{CC\_PA}$ for the power amplifier 1113 that changes in relation to the envelope of the RF signal $RF_{IN}$. The power amplifier 1113 receives the RF signal $RF_{IN}$ from the I/Q modulator 1110, and provides an amplified RF signal $RF_{OUT}$ to the antenna 1116 through the duplexing and switching circuit 1115, in this example.

The directional coupler 1114 is positioned between the output of the power amplifier 1113 and the input of the duplexing and switching circuit 1115, thereby allowing a measurement of output power of the power amplifier 1113 that does not include insertion loss of the duplexing and switching circuit 1115. The sensed output signal from the directional coupler 1114 is provided to the power detectors/multiplexer/baseband receiver circuitry 1111, which can be implemented in accordance with any of the embodiments herein.

The intermodulation detection circuit 1112 controls the pre-distortion provided by the DPD circuit 1109 and/or a delay of the signal delay circuit 1108 to control relative alignment between the envelope signal and the RF signal $RF_{IN}$. In certain implementations, the intermodulation detection circuit 1112 also serves to control shaping provided by the shaping circuit 1123 and/or to provide transmit power control.

By including a feedback path from the output of the power amplifier 1113 and baseband, the I and Q signals can be dynamically adjusted to optimize the operation of the communication system 1130. For example, configuring the communication system 1130 in this manner can aid in providing power control, compensating for transmitter impairments, and/or in performing DPD.

Although illustrated as a single stage, the power amplifier 1113 can include one or more stages. Furthermore, the teachings herein are applicable to communication systems including multiple power amplifiers. In such implementations, separate envelope trackers can be provided for different power amplifiers and/or one or more shared envelope trackers can be used.

Figure 18:
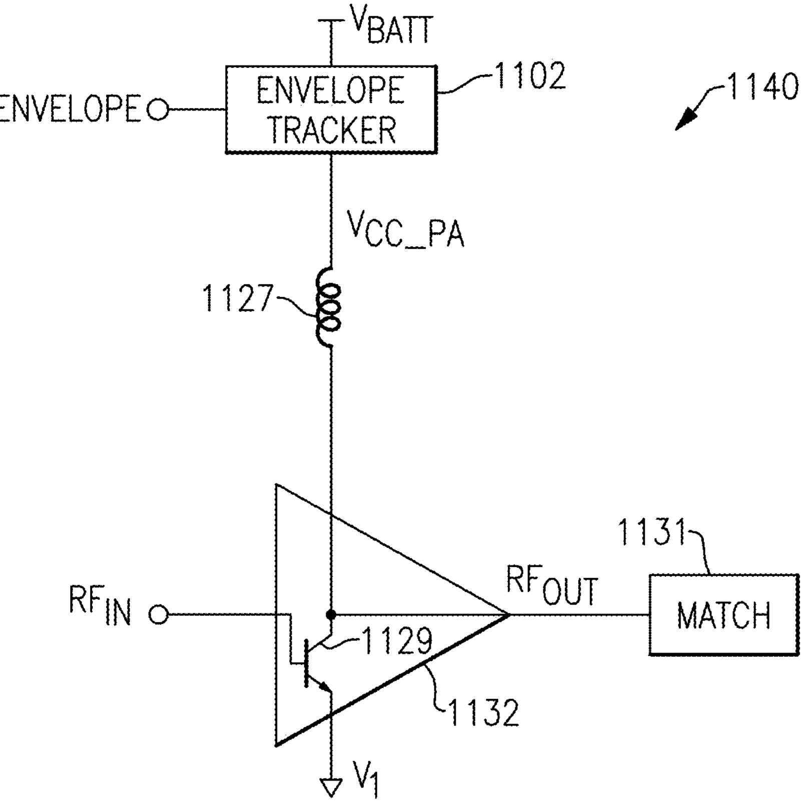
FIG. 18 is a schematic diagram of one example of a power amplifier system including an envelope tracker.

FIG. 18 is a schematic diagram of one example of a power amplifier system 1140 including an envelope tracker 1102. The illustrated power amplifier system 1140 further includes an inductor 1127, an output impedance matching circuit 1131, and a power amplifier 1132. The illustrated envelope tracker 1102 receives a battery voltage $V_{BATT}$ and an envelope of the RF signal and generates a power amplifier supply voltage $V_{CC\_PA}$ for the power amplifier 1132.

The illustrated power amplifier 1132 includes a bipolar transistor 1129 having an emitter, a base, and a collector. As shown in FIG. 18, the emitter of the bipolar transistor 1129 is electrically connected to a power low supply voltage V1, which can be, for example, a ground supply. Additionally, an RF signal ($RF_{IN}$) is provided to the base of the bipolar transistor 1129, and the bipolar transistor 1129 amplifies the RF signal to generate an amplified RF signal at the collector. The bipolar transistor 1129 can be any suitable device. In one implementation, the bipolar transistor 1129 is a heterojunction bipolar transistor (HBT).

The output impedance matching circuit 1131 serves to terminate the output of the power amplifier 1132, which can aid in increasing power transfer and/or reducing reflections of the amplified RF signal generated by the power amplifier 1132. In certain implementations, the output impedance matching circuit 1131 further operates to provide harmonic termination and/or to control a load line impedance of the power amplifier 1132.

The inductor 1127 can be included to provide the power amplifier 1132 with the power amplifier supply voltage $V_{CC\_PA}$ generated by the envelope tracker 1102 while choking or blocking high frequency RF signal components. The inductor 1127 can include a first end electrically connected to the envelope tracker 1102, and a second end electrically connected to the collector of the bipolar transistor 1129. In certain implementations, the inductor 1127 operates in combination with the impedance matching circuit 1131 to provide output matching.

Although FIG. 18 illustrates one implementation of the power amplifier 1132, skilled artisans will appreciate that the teachings described herein can be applied to a variety of power amplifier structures, such as multi-stage power amplifiers and power amplifiers employing other transistor structures. For example, in some implementations the bipolar transistor 1129 can be omitted in favor of employing a field-effect transistor (FET), such as a silicon FET, a gallium arsenide (GaAs) high electron mobility transistor (HEMT), or a laterally diffused metal oxide semiconductor (LDMOS) transistor. Additionally, the power amplifier 1132 can be adapted to include additional circuitry, such as biasing circuitry.

Figure 19A:
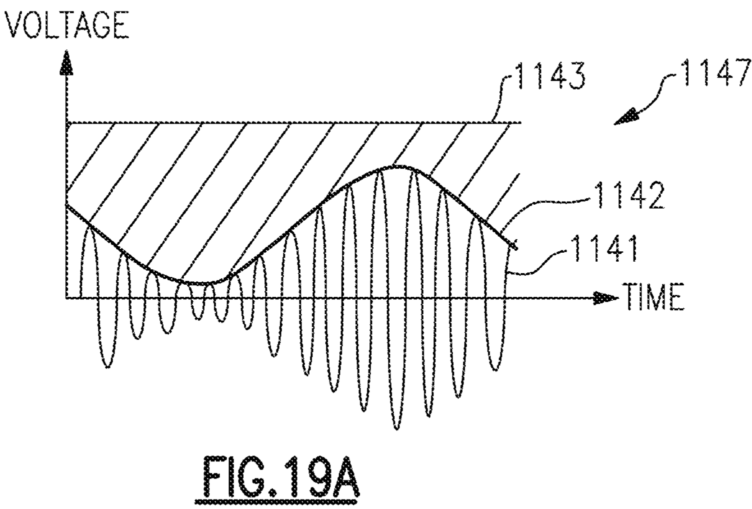
FIG. 19A shows a first example of a power amplifier supply voltage versus time.
Figure 19B:
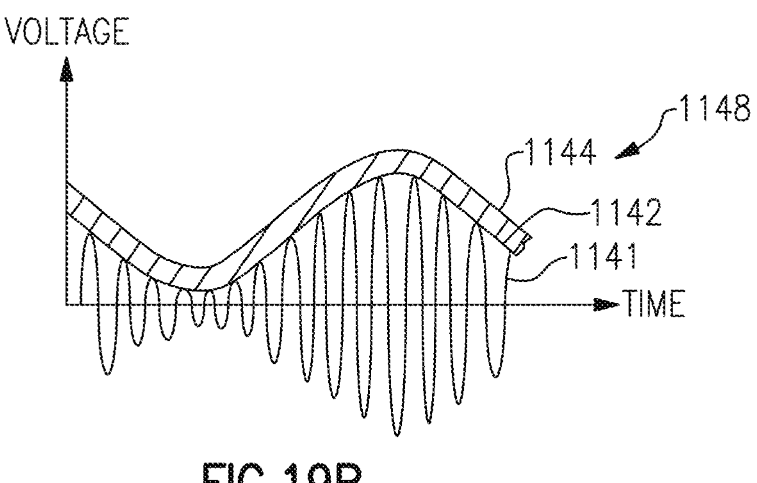
FIG. 19B shows a second example of a power amplifier supply voltage versus time.

FIGS. 19A and 19B show two examples of power amplifier supply voltage versus time.

In FIG. 19A, a graph 1147 illustrates one example of the voltage of an RF signal 1141 and a power amplifier supply voltage 1143 versus time. The RF signal 1141 has an envelope 1142.

It can be important that the power amplifier supply voltage 1143 of a power amplifier has a voltage greater than that of the RF signal 1141. For example, powering a power amplifier using a power amplifier supply voltage that has a magnitude less than that of the RF signal can clip the RF signal, thereby creating signal distortion and/or other problems. Thus, it can be important the power amplifier supply voltage 1143 be greater than that of the envelope 1142. However, it can be desirable to reduce a difference in voltage between the power amplifier supply voltage 1143 and the envelope 1142 of the RF signal 1141, as the area between the power amplifier supply voltage 1143 and the envelope 1142 can represent lost energy, which can reduce battery life and increase heat generated in a wireless device.

In FIG. 19B, a graph 1148 illustrates another example of the voltage of an RF signal 1141 and a power amplifier supply voltage 1144 versus time. In contrast to the power amplifier supply voltage 1143 of FIG. 19A, the power amplifier supply voltage 1144 of FIG. 19B changes in relation to the envelope 1142 of the RF signal 1141. The area between the power amplifier supply voltage 1144 and the envelope 1142 in FIG. 19B is less than the area between the power amplifier supply voltage 1143 and the envelope 1142 in FIG. 19A, and thus the graph 1148 of FIG. 19B can be associated with a power amplifier system having greater energy efficiency.

Conclusion

Some of the embodiments described above have provided examples in connection with mobile devices. However, the principles and advantages of the embodiments can be used for any other systems or apparatus that have needs for power detection.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above,"

"below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A mobile device comprising:

a transceiver configured to generate a radio frequency transmit signal; and a front end system including a power amplifier configured to amplify the radio frequency transmit signal to generate a radio frequency output signal, a directional coupler configured to generate a single-ended radio frequency signal based on sensing the radio frequency output signal, and a power detector configured to receive the single-ended radio frequency signal and to generate a differential power detection signal that indicates an output power of the power amplifier.

2. The mobile device of claim 1 further comprising an antenna configured to transmit the radio frequency output signal.

3. The mobile device of claim 2 wherein the single-ended radio frequency signal indicates a forward power to the antenna.

4. The mobile device of claim 2 wherein the single-ended radio frequency signal indicates a reverse power to the antenna.

5. The mobile device of claim 1 wherein the front end system further includes a plurality of power detectors including the power detector, and a multiplexer configured to output a selected differential power detection signal chosen from the plurality of power detectors.

6. The mobile device of claim 5 wherein the front end system further includes an amplifier configured to convert the selected differential power detection signal to a single-ended power detection signal referenced to an offset.

7. The mobile device of claim 5 wherein the two or more power detectors are configured to detect an output power of at least two power amplifiers.

8. The mobile device of claim 5 wherein the two or more power detectors are configured to detect a forward power of the power amplifier and a reverse power of the power amplifier.

9. The mobile device of claim 1 wherein the radio frequency output signal is a cellular signal in fifth generation frequency range two.

10. The mobile device of claim 1 further comprising a baseband receiver configured to generate power data based on the differential power detection signal.

11. A power amplifier system comprising:

a power amplifier configured to amplify a radio frequency transmit signal to generate a radio frequency output signal;

a directional coupler configured to generate a single-ended radio frequency signal based on sensing the radio frequency output signal; and a power detector configured to receive the single-ended radio frequency signal and to generate a differential power detection signal that indicates an output power of the power amplifier.

12. The power amplifier system of claim 11 further comprising a plurality of power detectors including the power detector, and a multiplexer configured to provide a selected differential power detection signal from the plurality of power detectors.

13. The power amplifier system of claim 12 further comprising an amplifier configured to convert the selected differential power detection signal to a single-ended power detection signal referenced to an offset.

14. A method of signal power detection in a mobile device, the method comprising:

generating a radio frequency transmit signal using a transceiver;

amplifying the radio frequency transmit signal to generate a radio frequency output signal using a power amplifier;

generating a single-ended radio frequency signal based on sensing the radio frequency output signal using a directional coupler; and generating a differential power detection signal from the single-ended radio frequency signal using a power detector, the differential power detection signal indicating an output power of the power amplifier.

15. The method of claim 14 wherein the single-ended radio frequency signal indicates a forward power to an antenna.

16. The method of claim 14 wherein the single-ended radio frequency signal indicates a reverse power to an antenna.

17. The method of claim 14 further comprising generating a selected differential power detection signal from choosing from amongst a plurality of power detectors using a multiplexer, the plurality of power detectors including the power detector.

* * * * *